United States Patent
Yoshioka et al.

(10) Patent No.: US 11,429,125 B1
(45) Date of Patent: Aug. 30, 2022

(54) MITIGATION OF VOLTAGE SHIFT INDUCED BY MECHANICAL STRESS IN BANDGAP VOLTAGE REFERENCE CIRCUITS

(71) Applicant: Texas Instruments Incorporated, Dallas, TX (US)

(72) Inventors: Masahiro Yoshioka, Allen, TX (US); Jeffrey David Johnson, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/205,155

(22) Filed: Mar. 18, 2021

(51) Int. Cl.
  G05F 1/10 (2006.01)
  G05F 1/46 (2006.01)
  H03K 17/60 (2006.01)
  H03M 1/66 (2006.01)

(52) U.S. Cl.
  CPC .............. G05F 1/46 (2013.01); H03K 17/60 (2013.01); H03M 1/66 (2013.01)

(58) Field of Classification Search
  CPC combination set(s) only.
  See application file for complete search history.

(56) References Cited

U.S. PATENT DOCUMENTS

| | | | | |
|---|---|---|---|---|
| 4,317,054 A * | 2/1982 | Caruso | ....................... | G05F 3/30 327/539 |
| 4,375,595 A | 3/1983 | Ulmer et al. | | |
| 5,059,820 A | 10/1991 | Westwick | | |
| 10,712,875 B2 * | 7/2020 | Malevsky | ................. | G05F 3/30 |
| 2006/0001413 A1 | 1/2006 | Marinca | | |

OTHER PUBLICATIONS

Banba, et al., "A CMOS Bandgap Reference Circuit with Sub-1-V Operation," IEEE Journal of Solid-State Circuits, vol. 34, No. 5, May 1999. pp. 670-674.
Brokaw, A. Paul, "A Simple Three-Terminal IC Bandgap Reference," IEEE Journal of Solid-State Circuits, vol. SC-9, No. 6, Dec. 1974. pp. 388-393.

(Continued)

*Primary Examiner* — Long Nguyen
(74) *Attorney, Agent, or Firm* — John R. Pessetto; Charles A. Brill; Frank D. Cimino

(57) ABSTRACT

A bandgap voltage reference circuit includes first and second transistors (e.g., 3-terminal BJTs or diode-connected BJTs), and a PTAT element (e.g., resistance or capacitance). The first transistor is at a first die location, and operates with a first base-emitter voltage. The second transistor is at a second die location, and operates with a second base-emitter voltage. Each of the first and second transistors may include multiple individual parallel-connected transistors. The PTAT element is operatively coupled to the first and second transistors such that a voltage difference between the first and second base-emitter voltages drops across the PTAT element. The first and second locations are separated by a distance (e.g., 1.5% or more of die length, or such that the respective centroids of the first and second transistor are spaced from one another). Such spatial distribution helps mitigate voltage shift induced by mechanical stress, and is insensitive to process variation.

19 Claims, 17 Drawing Sheets

(56) References Cited

OTHER PUBLICATIONS

Hsieh, et al., "A 1-V, 16 9 ppm/ 0C, 250 nA Switched-Capacitor CMOS Voltage Reference," IEEE Transactions on Very Large Scale Integration (VLSI) Systems, vol. 19, No. 4, Apr. 2011. pp. 659-667.
"Bandgap voltage reference," Wikipedia, retrieved from the Internet on Oct. 8, 2020; https://en.wikipedia.org/wiki/Bandgap_voltage_reference, pp. 1-4.
"Brokaw bandgap reference," Wikipedia, retrieved from the Internet on Oct. 12, 2020; https://en.wikipedia.org/wiki/Brokaw_bandgap_reference, pp. 1-2.
"Chapter 14: Voltage References," Analog Devices Wiki, retrieved from the Internet on Oct. 12, 2020; https://wiki.analog.com/university/courses/electronics/text/chapter-14, pp. 1-13.
McLeod, Scott, "Low Power Switched Cap Bandgap," planetanalog.com/low-power-switched-cap-bandgap/, Dec. 13, 2015, p. 1-4.
McLeod, Scott, "Low Power Switched Capacitor Bandgap, Part 2," planetanalog.com/low-power-switched-capacitor-bandgap-part 2/, Feb. 22, 2016, p. 1-4.
Muller, Perry and Moore, Doug, "Precision voltage references," Analog Applications Journal, Nov. 1999, pp. 1-5.
Megaw, David, "Voltage Reference Selection Basics," Power/Designer, No. 123, 2008. 11 pages.
International Search Report, Application No. PCT/US2022/020679, dated Jun. 29, 2022, 4 pgs.

\* cited by examiner

DIFFERENCE OF CENTERLINE POINTWISE DISTANCES OF TWO ARRAYS (POSITION-DEPENDENCY OF SOLDER-DOWN STRESS)

MITIGATION OF VOLTAGE SHIFT INDUCED BY MECHANICAL STRESS IN BANDGAP VOLTAGE REFERENCE CIRCUITS

FIELD OF THE DISCLOSURE

This disclosure relates to bandgap voltage reference circuits, and more particularly, to mitigation of voltage shift induced by mechanical stress in bandgap voltage reference circuits.

BACKGROUND

A bandgap voltage reference is an electrical circuit that outputs a fixed voltage that is stable over temperature. In general, a bandgap voltage reference circuit is configured to generate first and second internal voltages that are summed together to provide the output voltage. The reason the output voltage is temperature-insensitive is because the first internal voltage source has a positive temperature coefficient, and the second internal voltage source has a negative temperature coefficient. Thus, by summing the first and second internal voltages, the temperature-dependence is canceled or otherwise mitigated. Although there are many instantiations, one such example circuit is implemented in silicon using bipolar junction transistors, and has an output voltage of about 1.25 V, which roughly corresponds to the theoretical band gap of silicon (~1.22 eV at 0 K).

Such bandgap voltage reference circuits have many applications. One such example application is in the context of a digital-to-analog converter (DAC), which converts a digital input word to an analog output voltage. The analog output voltage is based on the digital word and a voltage reference generated internal to the DAC. A similar application is in the context of an analog-to-digital converter (ADC), which converts an analog input signal to its digital equivalent. The digital output word is based on the analog input and an internal voltage reference. In either of these example applications, the internal voltage reference can be provided by a bandgap voltage reference circuit, which helps keep the conversion process of the DAC or ADC accurate over a relatively broad range of temperature.

Unfortunately, there remain unresolved issues with respect to bandgap voltage reference circuits.

SUMMARY

Integrated circuits including a bandgap voltage reference circuit are disclosed, as well as electronic systems that include the integrated circuits.

In one example, the integrated circuit includes a package, and a die fixed within the package. The die includes a bandgap voltage reference circuit, the die having opposing edges that partially define an outer perimeter of the die. The opposing edges are separated by a distance $D_1$. The bandgap voltage reference circuit includes a first transistor, a second transistor, and a resistor or capacitor. The first transistor is at a first location of the die, and is to operate with a first base-emitter voltage. The second transistor is at a second location of the die, and is to operate with a second base-emitter voltage. The resistor or capacitor is operatively coupled to the first and second transistors such that a voltage difference between the first and second base-emitter voltages drops across the resistor or capacitor. The second location is separated from the first location by a distance $D_2$. The distance $D_2$ is at least 1.5% of the distance $D_1$.

In another example, the integrated circuit includes a package, and a die fixed within the package. The die includes a bandgap voltage reference circuit. The bandgap voltage reference circuit is configured to add a proportional to absolute temperature (PTAT) voltage to a complementary to absolute temperature (CTAT) voltage, and includes an array, a resistor, and a summing circuit. The array includes a first bipolar junction transistor (BJT) and a second BJT, the first BJT to operate with a first base-emitter voltage, and the second BJT to operate with a second base-emitter voltage. The centroid of the array, the centroid of the first BJT, and the centroid of the second BJT are spaced from one another. The PTAT element is operatively coupled to the first and second BJTs such that a voltage difference between the first and second base-emitter voltages drops across the PTAT element. The summing circuit is configured to generate a voltage reference output based on (1) the voltage difference between the first and second base-emitter voltages and (2) the first base-emitter voltage or another base-emitter voltage.

In another example, the integrated circuit includes a package, and a die fixed within the package. The die includes a bandgap voltage reference circuit. The die has a center point and a stress profile, such that surface stress of the die decreases with increasing distance from the center point. The bandgap voltage reference circuit is configured to add a proportional to absolute temperature (PTAT) voltage to a complementary to absolute temperature (CTAT) voltage, and includes a first bipolar junction transistor, second bipolar junction transistor, a resistance or capacitance, and a summing circuit. The first bipolar junction transistor is at a first location of the die and to operate with a first base-emitter voltage, and the first location is a first distance from the center point of the die and associated with a first stress value. The second bipolar junction transistor is at a second location of the die and to operate with a second base-emitter voltage, and the second location is a second distance from the center point of the die and associated with a second stress value. The second distance is different from the first distance, and the second stress value different from the first stress value. The resistance or capacitance is operatively coupled to the first and second bipolar junction transistors such that a voltage difference between the first and second base-emitter voltages drops across the resistance or capacitance. The summing circuit is configured to generate a voltage reference output based on (1) the voltage difference between the first and second base-emitter voltages and (2) the first base-emitter voltage or another base-emitter voltage.

BRIEF DESCRIPTION OF THE DRAWINGS

FIG. 1c illustrates the non-distributed nature of the transistor array of the bandgap voltage reference circuit of FIG. 1a.

DETAILED DESCRIPTION

Figure 1A:
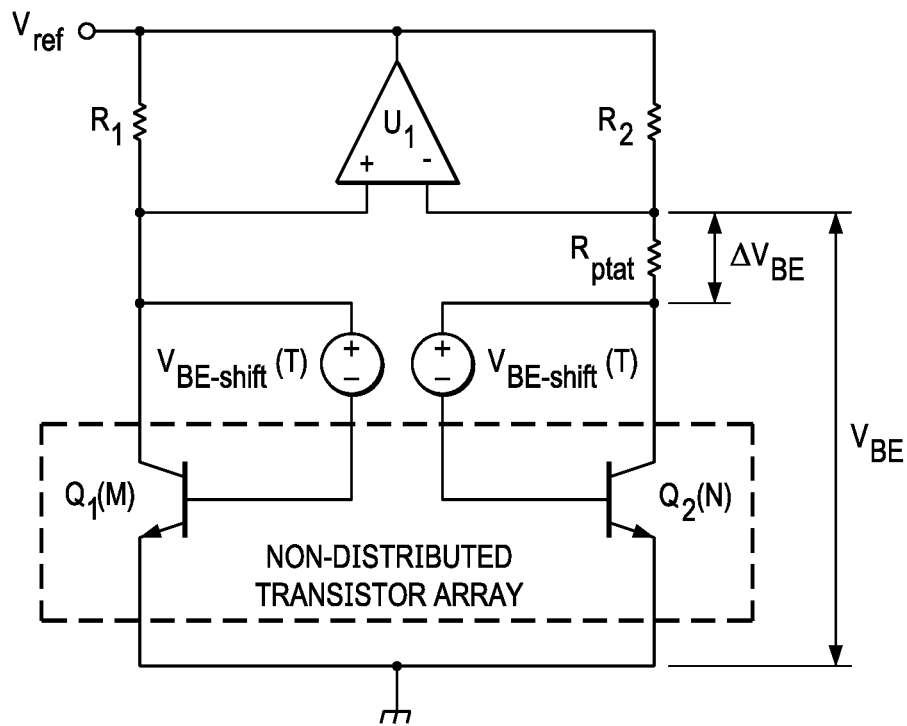
FIG. 1a illustrates an example bandgap voltage reference circuit that is susceptible to base-emitter voltage shift over temperature, because of mechanical stress induced by the solder-down process.

Techniques are provided herein to reduce stress-induced output voltage shift of bandgap voltage reference circuits. Although the techniques can be useful in a number of circumstances where mechanical stress induces voltage shift, they are particularly useful in addressing voltage and temperature coefficient shift of an integrated bandgap voltage reference circuit that results from mechanical stress caused by the solder-down process when attaching the integrated circuit package and die assembly to a printed circuit board. According to an embodiment of the present disclosure, a bandgap voltage reference circuit includes a spatially distributed transistor array. In some such embodiments, the transistors of the array are bipolar junction transistors (BJTs), although other active junction devices that exhibit a linear voltage shift with respect to temperature and mechanical stress can be used, as will be appreciated in light of this disclosure. In any such cases, rather than clustering all of the active junction devices of the array into a single die location as is normally done, one or more of the active junction devices of the array is intentionally spaced from the other active junction devices of the array. In this manner, the array is spatially distributed to two different die locations, and the different locations experience different amounts of mechanical stress induced by the solder-down process. For example, with some integrated circuits, a solder-down induced mechanical stress is the highest at the middle of the die, and is lower proximate to edges of the die. So, in such an example case, by placing one or more transistors of the array proximate to the edge of the die, and placing the one or more remaining transistors of the array in the middle of the die, the absolute temperature coefficient shift is cancelled, offset or otherwise reduced by a relative temperature coefficient shift between those two differently-stressed positions. Other such transistor array distribution schemes where first and second portions of the array are spaced from one another in a manner that has a temperature coefficient shift mitigation effect can be similarly used. Numerous variations will be appreciated in light of this disclosure.

General Overview

As previously explained, a bandgap voltage reference is an electrical circuit that outputs a fixed voltage that is stable over temperature. However, such circuits are also susceptible to a stress-induced shift in temperature coefficient and output voltage, caused by mechanical stress in the die which includes the circuit. One such stress is solder-down stress, which refers to the stress imparted on the die when the integrated circuit package containing that die is soldered down onto a printed circuit board (PCB). For instance, each of the die (e.g., silicon or other semiconductor material(s)), package mold compound, and PCB can have different coefficients of thermal expansion that create temperature dependent stress on the BJTs or other active junction devices that are to generate a temperature-invariant voltage reference. Moreover, the rigid attachment of the integrated circuit to copper PCB traces creates a boundary condition on that stress. Hence, a solder-down shift can cause a degradation in performance relative to the pre-solder-down performance. A dominant factor of this temperature coefficient shift is believed to be the base-emitter voltage ($V_{BE}$) shift of a BJT-based array. One technique to address this problem is to integrate a stress gage or sensor on the die to measure a stress level of a critical cell and configure a feedforward cancellation based on the stress sensor and temperature sensor outputs. This approach, however, necessitates extra circuits, such as X-Y-Z directional stress sensors, temperature sensors, a digital signal processor (DSP), and memory. In addition, a characterization effort to find out the best coefficients for each temperature and stress sensor output is not a trivial task.

Thus, techniques are provided herein to mitigate or otherwise reduce solder-down induced shift of the temperature coefficient of bandgap voltage reference circuits, without requiring extra circuitry such as strain and temperature sensors. A circuit architecture employing the techniques allows for cancellation or reduction of the absolute temperature coefficient shift by a relative temperature coefficient shift, wherein the absolute and relative temperature coefficient shifts are caused by mechanical stress on the die surface, induced by the solder-down process. No extra circuits are needed because, according to some such embodiments, the bipolar junction transistors (or other comparable devices) of the array itself are effectively used to sense and mitigate the solder-down stress. In particular, and in accordance with an embodiment, by selectively positioning bipolar junction transistors of the array at first and second die locations that are spaced from one another and experience different amounts of mechanical stress, the absolute $V_{BE}$ shift can be canceled or otherwise reduced by the relative $V_{BE}$ shift. In this manner, the array is said to be distributed, which is in contrast to standard bandgap voltage reference circuits which utilize an undistributed array that has a common centroid. As will be appreciated, the techniques allow for smaller implementation and lower costs, and can be achieved by any number of standard or proprietary process technologies and are insensitive to process variation, according to some embodiments.

The distributed nature of the array can be characterized in a number of ways. In one example characterization, the spacing between the two differently-stressed array portions can be thought of in the absolute sense as the distance between the two locations, such as the example case where each location has a discrete perimeter within which are located the individual transistors of that location and the spacing is the distance from one perimeter edge to the other perimeter edge (or from the geometric center of each perimeter, or some other consistent measurement point associated with each perimeter). In another example characterization, the spacing between the two differently-stressed array portions can be thought of in the relative sense as the distance of each location from a common reference point of the die, such as the example case where the common reference point is the center point of the die and one location is closer to the die center point than the other location. Note that both of these example characterizations are agnostic as to which individual transistors of the array are in which location, and focus on the absolute or relative spacing of the two locations. In another example characterization, the spacing between the two differently-stressed array portions can be thought of in terms of the distance between the centroids of the active devices formed by the overall array, such as the example case where the array includes first and second transistor devices and the centroid of the first transistor device is spaced from the centroid of the second transistor device. Note that in a standard bandgap voltage reference circuit, these centroids are co-located, along with the centroid of the overall array. In any of these example characterizations, further note that one or both of the active transistor devices may include multiple individual transistors connected in parallel, and that some individual transistors of a given parallel combination may be at the first location and other individual transistors of that given parallel combination may be at the second location. Further note that each of the two locations (and thus the two array portions) is subjected to a different stress, given the post solder-down stress profile of the die.

Although the differently-stressed locations of the array transistors can vary depending on the configuration of the integrated circuit package containing the bandgap voltage reference circuit, in some example embodiments a first portion of the array is located in a middle region of the die, and a second portion of the array is located near an edge of the die. In such cases, the distance between the spaced array portions is relatively large, particularly when compared to standard bandgap voltage reference circuits in which all of the individual transistors of the array are clustered together in the same location as close together as possible and have a common centroid, with relatively little or no space therebetween and with no regard to the die stress profile. For example, in some embodiments, the distance between the differently-stressed array portions is in the range of about 1.5% to 65% of the total distance from one edge of the die to the other opposing edge of the die. In still other embodiments, the distance between the differently-stressed array portions can be relatively small but still much greater than the de minimis spacing of the array of standard bandgap voltage reference circuits. For instance, in some such embodiments, the distance between the respective array portions is equal to or greater than the lateral width of an individual cell of the array, or even less than this width. Depending on the type of device (e.g., BJTs or diode-connected BJTs) being used in the array and the process technology used to form that device, this lateral width can vary greatly, but in some example embodiments is in the range of 50 to 150 microns (µm). In any such cases, such intentional spacing of the array portions to differently-stressed die locations, whether a relatively large or relatively small spacing, would cause the centroids of the active devices formed in that array to be spaced from one another. In contrast, an array of a standard bandgap voltage reference circuit has a common centroid shared by the overall array itself as well as the active devices formed in that array.

A band-gap reference in one of its simplest forms is two bipolar junction transistors (BJTs) with different sized emitter areas. Each transistor has a different base-emitter voltage ($V_{BE}$) set by its current density. The relative difference between the $V_{BE}$ of the first transistor and the $V_{BE}$ of the second transistor ($\Delta V_{BE}$) has a positive temperature coefficient, while the $V_{BE}$ for each of the first and second transistors has a negative temperature coefficient. Thus, as the relative difference in $V_{BE}$ between the first and second transistors ($\Delta V_{BE}$) shifts in a positive direction with a given temperature change, and the $V_{BE}$ of the first (or second) transistor shifts in a negative direction with that temperature change, thereby effectively cancelling or otherwise reducing temperature-based shift in the output voltage. Said differently, a bandgap voltage reference is created when a specific proportional to absolute temperature (PTAT) voltage (relative difference in $V_{BE}$) is added to the complementary to absolute temperature (CTAT) voltage, thereby yielding a voltage at roughly the bandgap energy of silicon (~1.2V), assuming silicon-based process technology. Note that devices made with other semiconductor materials will provide a different bandgap energy, so the output voltage reference depends on the semiconductor materials used as well as the circuit configuration, as will be appreciated.

Figure 6A:
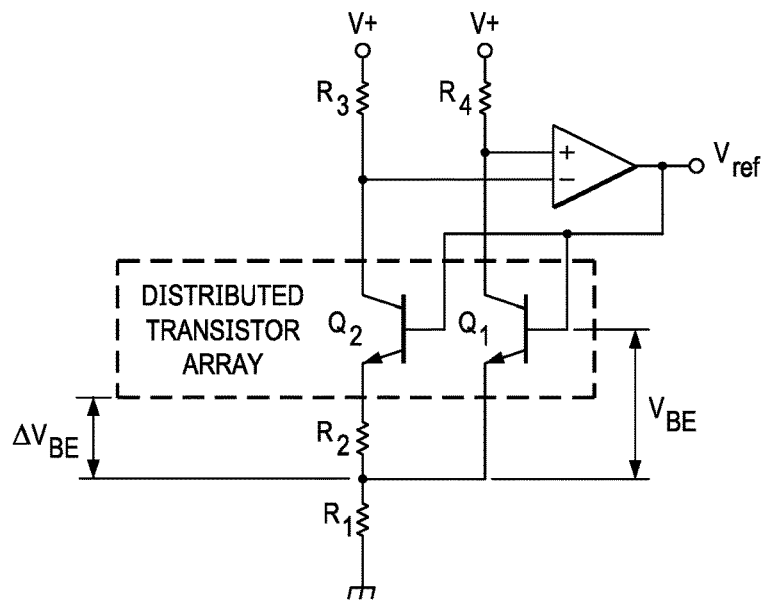
FIGS. 6a-c each illustrates another example bandgap voltage reference circuit configured with a spatially distributed transistor array, to mitigate base-emitter voltage shift over temperature due to mechanical stress induced by the solder-down process, in accordance with an embodiment of the present disclosure.
Figure 6B:
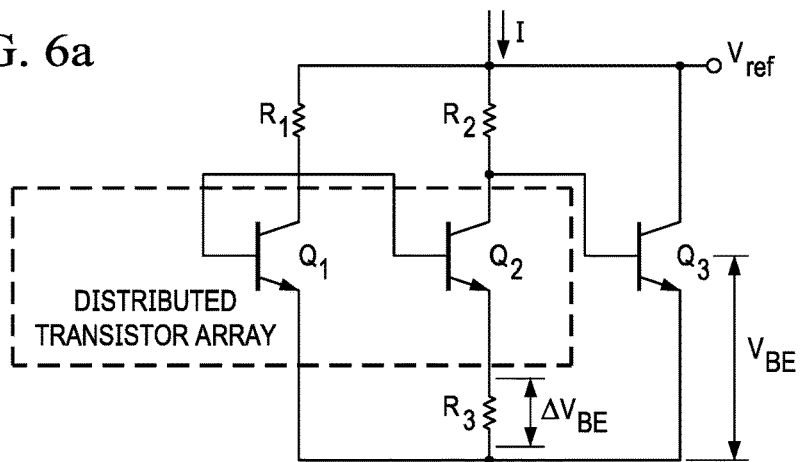

To this end, while the techniques provided herein are particularly well-suited for silicon-based BJT-based bandgap voltage reference circuits, they can be used with any voltage reference circuits where the voltage difference between two p-n junction devices (e.g., 3-terminal BJTs, diode-connected BJTs, or comparable devices), operated at different current densities, can be used to generate a proportional to absolute temperature (PTAT) voltage across a PTAT element (e.g., resistor or capacitor), and that PTAT voltage can be added to the complementary to absolute temperature (CTAT) voltage across one of the devices (or yet another device, as is the case in the Widlar topology, as shown in the example of FIG. 6b), thereby yielding an output voltage at roughly the bandgap energy of semiconductor material used to make the devices. Such a circuit can be more simply expressed or otherwise represented with the equation: $V_{ref}=V_{BE1}+\lambda(V_{BE1}-V_{BE2})$, where $\lambda$, is the scale factor (set by biasing resistors of the bandgap voltage reference circuit), $V_{BE2}$ is the base-emitter voltage of the larger of the two devices, $V_{BE1}$ is the base-emitter voltage of the second device, and $V_{ref}$ is the reference output voltage generated by the bandgap voltage reference circuit. As will be explained in turn, note that the larger transistor can be created by connecting a number of individual transistors in parallel, or by making the emitter area of a single individual transistor larger, relative to the other transistor. Further note that the PTAT element across which the PTAT voltage can be measured or otherwise accessed can vary depending on which bandgap voltage reference topology is used. For instance, the PTAT element can be resistive (one or more resistors) in some cases (e.g., such as in the Brokaw and Widlar topologies), or capacitive (one or more capacitors) in still other cases (e.g., such as in switched capacitor topologies).

Circuit Architecture

Before describing example topology configured in accordance with an embodiment of the present disclosure, it may be helpful to first illustrate a problem that such topologies address. To this end, FIG. 1a illustrates an example bandgap voltage reference circuit that is susceptible to base-emitter voltage shift over temperature ($V_{BE\text{-}shift}(T)$), because of mechanical stress induced by the solder-down process. As can be seen in this example, the transistor array is non-distributed, in that all transistors making up $Q_1$ and $Q_2$ are densely positioned in one die location, as shown in FIG. 1c. In this example case, $Q_1$ is a single individual transistor of the array, and $Q_2$ is eight individual transistors of the array connected in parallel. Note that $Q_1$, $Q_2$, and the overall array all have a common centroid (generally designated with a bolded circle). FIG. 1d illustrates another example array having a common centroid, where the array includes a single individual transistor for $Q_1$ and two individual transistors connected in parallel for $Q_2$ (the common centroid is shown at the intersection of the dashed lines). As can be further seen in FIG. 1a, transistor $Q_1$ is an NPN BJT that includes M individual transistors connected in parallel, while transistor $Q_2$ is an NPN BJT that includes N individual transistors connected in parallel, wherein each of M and N is an integer (1, 2, 3, . . . ). The circuit further includes biasing resistors $R_1$, $R_2$, and $R_{ptat}$, which effectively define the scale factor of the voltage reference circuit. The circuit further includes an operational amplifier operatively coupled with transistors $Q_1$ and $Q_2$ and the resistors $R_1$, $R_2$, and $R_{ptat}$, to achieve a temperature-insensitive output voltage $V_{ref}$ by cancellation between the positive temperature coefficient brought by $\Delta V_{BE}$ and the negative temperature coefficient brought by $V_{BE}$, as expressed in Equations 1-3 below. Note that k is the Boltzmann constant, T is the absolute temperature of the devices making up the non-distributed transistor array, and q is the magnitude of charge of an electron (the elementary charge). Variations will be apparent, such as the case where there $$V_{REF} = V_{BE} + \Delta V_{BE}\frac{R_{tot}}{R_{ptat}} \quad \text{(Equation 1)}$$

$$\Delta V_{BE} = \frac{kT}{q}\ln\left(N / M\left(\frac{R_2}{R_1}\right)\right) \quad \text{(Equation 2)}$$

$$R_{tot} = R_2 \quad \text{(Equation 3)}$$

is a resistor Rb between ground and the emitters of $Q_1$ and $Q_2$, wherein $$R_{tot} = R_2 + \left(1 + \frac{R_2}{R_1}\right)R_b.$$

Figure 1B:
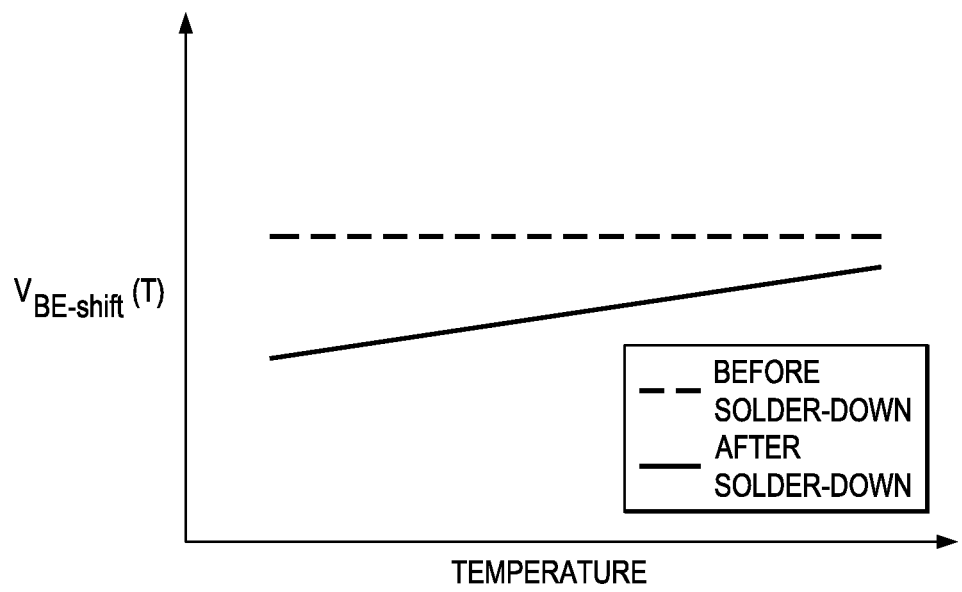
FIG. 1b illustrates the base-emitter voltage shift that occurs over temperature in the bandgap voltage reference circuit of FIG. 1a, as a result of the solder-down process.
Figure 1C:
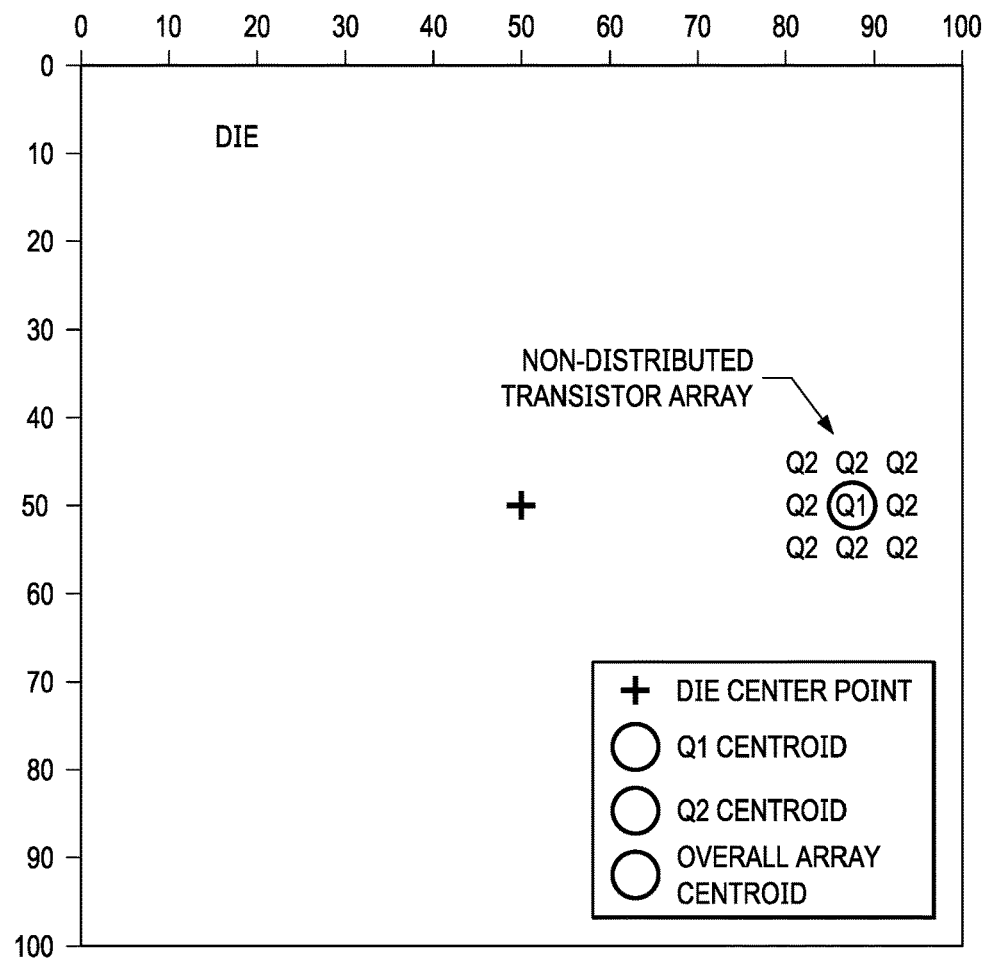
Figure 1D:
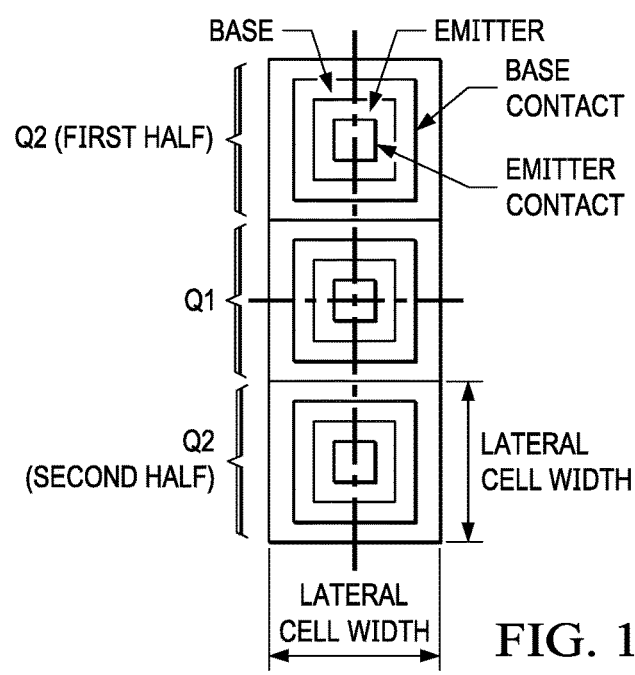
FIG. 1d illustrates a top down view of a non-distributed transistor array of a bandgap voltage reference circuit, such as the example of FIG. 1a, and shows the common centroid shared by both active devices of that array.

In any such cases, and as further illustrated in FIG. 1b, the base-emitter voltage of the transistor array still shifts, as a result of the solder-down process. Thus, the post-solder-down performance of the bandgap voltage reference circuit degrades from the pre-solder-down performance. One example post-solder-down performance test demonstrated an 11-12 ppm/C temperature coefficient shift for such a bandgap voltage reference circuit. Note that the amount of shift can depend on various factors, including, for example, the PCB thickness, encapsulation material, the process technology used to form the die, as well as the solder-down process itself.

In contrast, the bandgap voltage reference circuit techniques provided herein not only mitigate temperature-dependent base-emitter voltage drift but further mitigate the base-emitter voltage shift caused by mechanical stress on the die, induced by the solder-down process. In addition, the techniques are insensitive to process variation, and so they can be implemented with any number of semiconductor process technologies and materials. For instance, the circuitry can be implemented in silicon, germanium, silicon germanium, and group III-V materials such as gallium arsenide, to name a few examples. Further note that the techniques provided herein can be used with any number of topologies including standard bandgap voltage reference circuitry such as Brokaw, Widlar, and switched capacitor topologies, as well as proprietary topologies. In a more general sense, the techniques can be used in any bandgap voltage reference circuits having an array implemented with active junction devices, wherein the $\Delta V_{BE}$ PTAT (proportional to absolute temperature) term equals $$\frac{kT}{q}\ln\left(N / M\left(\frac{R_2}{R_1}\right)\right),$$

where N is the number of individual devices making up the larger device, and M is the number of individual devices making up the other device. To ease discussion, assume the active junction devices are transistors (e.g., 3-terminal BJTs, diode-connected BJTs, or other active junction devices that exhibit a linear voltage shift with respect to temperature and mechanical stress in a fashion comparable to a BJT). Note that the ratio of N/M can also be expressed as an emitter area ratio of single individual transistors for $Q_2$ and $Q_1$, where the $Q_2$ emitter is larger than the $Q_1$ emitter (instead of $Q_2$ including more parallel-connected individual transistors than $Q_1$). So, either multiple individual transistors connected in parallel, or single transistors having suitably sized emitters, can be used for $Q_1$ and $Q_2$ of the transistor array. Note, however, that using parallel-connected transistors works particularly well with respect to location-dependent stress tuning as variously provided herein, given the relative ease of adding/removing individual transistors to/from a parallel combination as compared to changing emitter size.

Figure 2A:
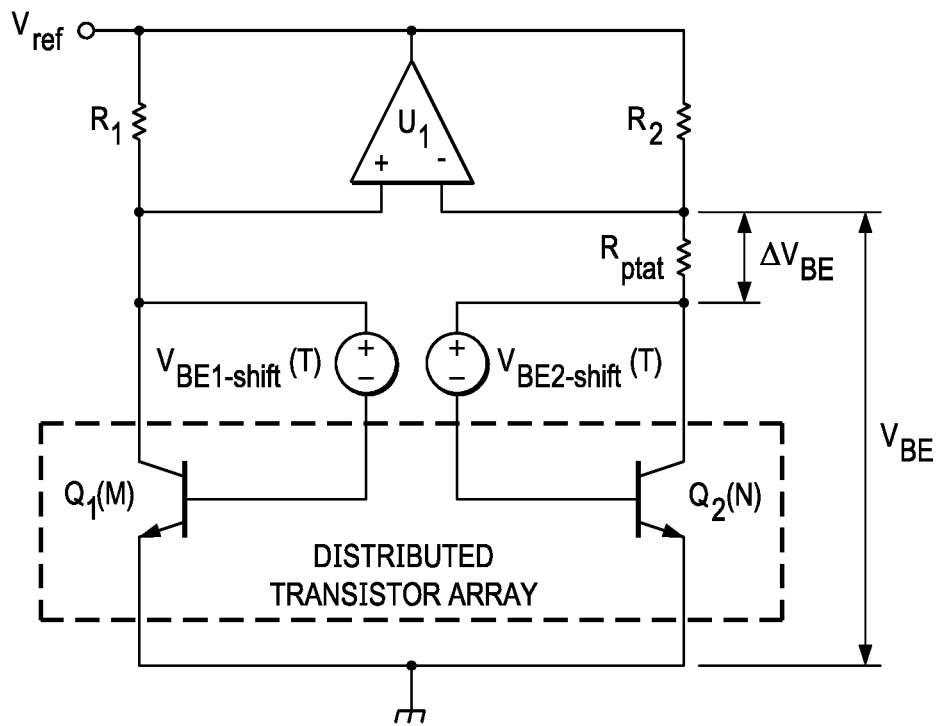
FIG. 2a illustrates an example bandgap voltage reference circuit configured with a spatially distributed transistor array, to mitigate base-emitter voltage shift over temperature due to mechanical stress induced by the solder-down process, in accordance with an embodiment of the present disclosure.
Figure 8:
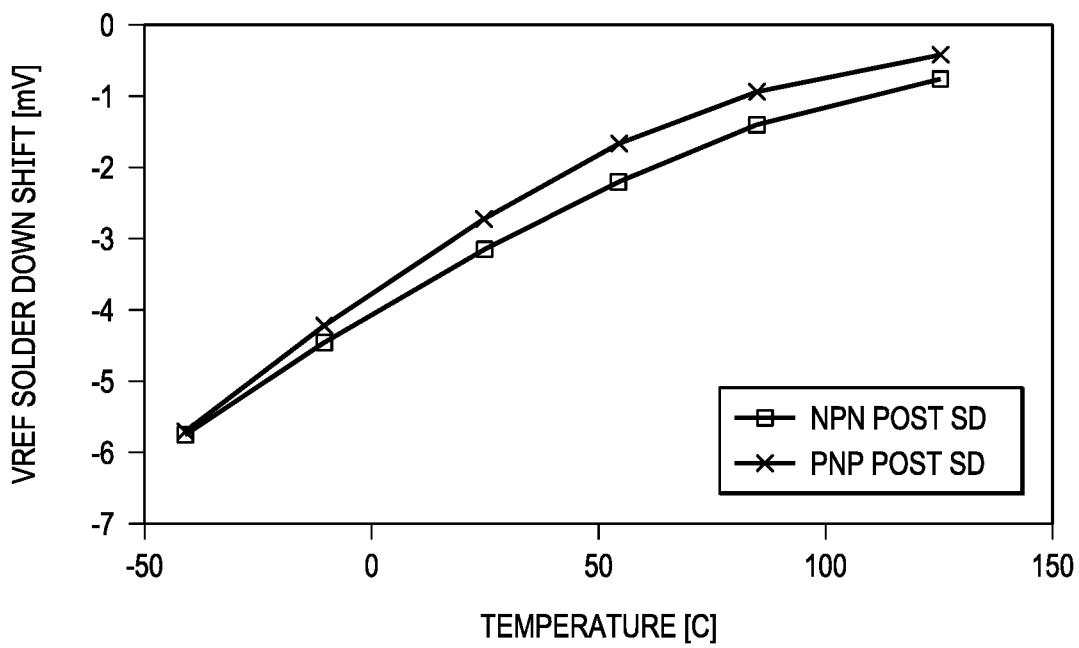
FIG. 8 illustrates that both NPN and PNP transistors are similarly susceptible to solder-down induced voltage shift, when used in the transistor array of bandgap voltage reference circuits.

In more detail, FIG. 2a illustrates an example bandgap voltage reference circuit similar to that shown in FIG. 1a. However, this bandgap voltage reference circuit is configured with a spatially distributed transistor array, to mitigate base-emitter voltage shift over temperature due to mechanical stress induced by the solder-down process, in accordance with an embodiment of the present disclosure. As can be seen, the transistor array includes transistors $Q_1$ and $Q_2$, which may be NPN or PNP transistors (both types respond similarly to mechanical stress induced by the solder-down process, as shown in FIG. 8). As previously explained, each of $Q_1$ and $Q_2$ may include a single individual transistor, or multiple individual transistors connected in parallel, such as the example case of $Q_1(M)$ and $Q_2(N)$, wherein M=2 and N=16; note, however, that if M or N equals 1, there is a single individual transistor (no parallel-connected transistors). In this specific example case, $Q_1$ and $Q_2$ are implemented with diode-connected NPN BJT. As will be appreciated, a diode-connected BJT is a BJT that has its collector connected to its base. A voltage source symbol is shown between the collector and base, simply to represent $V_{BE}$, referenced to ground in this example.

In any such cases, the bandgap voltage reference circuit achieves a temperature-insensitive output voltage $V_{ref}$ by cancellation between the positive temperature coefficient brought by $\Delta V_{BE}$ and the negative temperature coefficient brought by $V_{BE}$, as previously discussed with reference to Equations 1-3. Briefly, the transistor with the greater number of individual transistors connected in parallel (or otherwise larger emitter area) generates a smaller base-emitter voltage for the same or lower current, relative to the other transistor, and thus generates a difference between the two base-emitter voltages. The difference between the two base-emitter voltages is designated as $\Delta V_{BE}$ and has a positive temperature coefficient ($\Delta V_{BE}$ increases with temperature). In contrast, the base-emitter voltage $V_{BE}$ for each transistor of $Q_1$ and $Q_2$ has a negative temperature coefficient ($V_{BE}$ decreases with temperature). The circuit output $V_{ref}$ is equal to the sum of one of the base-emitter voltages $V_{BE}$ with the multiple N/M of the base-emitter voltage difference $\Delta V_{BE}$. With individual component choices suitable for a given application, the two opposing temperature coefficients will cancel or otherwise offset each other and the circuit output $V_{ref}$ that is insensitive to temperature.

Moreover, the circuit of FIG. 2a also achieves an output voltage $V_{ref}$ that is further insensitive to temperature coefficient shift due to mechanical strain induced by the solder-down process. This insensitivity is accomplished by intentionally positioning the transistors making up the distributed array at two distinct die locations that are spaced from one another, at different points in the overall die stress profile. Note this intentional spacing of the distributed array is relatively larger than the negligible or otherwise relatively very small spacing between individual transistors making up a non-distributed array. In particular, the transistors of a non-distributed array are formed directly on and/or in the die and separated by a process-specific pitch or critical dimension, and are thus spaced as closely together as possible. Moreover, standard practice is to arrange a single array such that $Q_1$ and $Q_2$ have a common centroid, as shown in FIGS. 1c-d. In contrast, the spacing of a distributed array according to an embodiment is such that the distance between two differently-stressed locations of the array is relatively large, such that the centroid of $Q_1$ is spaced from the centroid of $Q_2$, as shown in each of the example embodiments of FIGS. 2c-g.

Figure 2B:
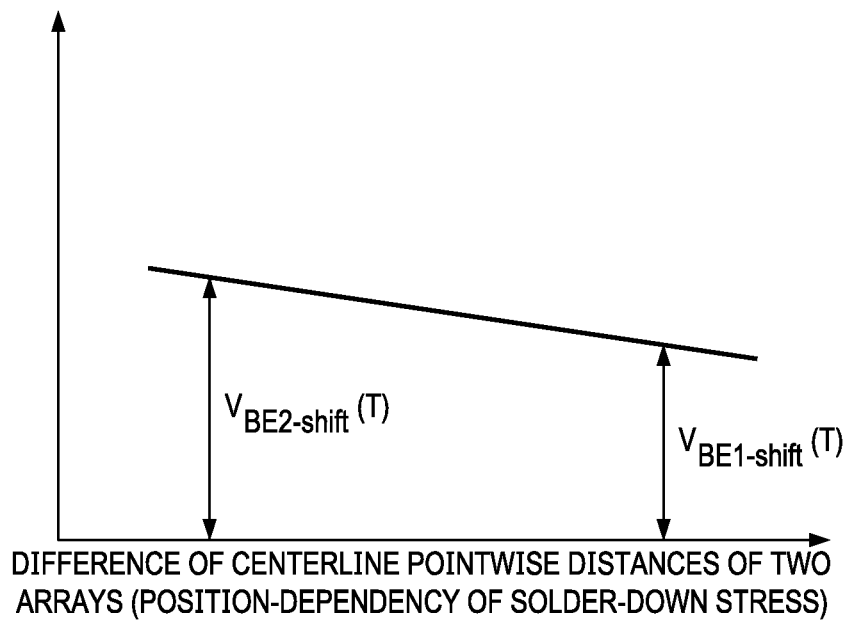
FIG. 2b illustrates a simulation or characterization plot which shows the dependency of base-emitter voltage shift on transistor positions of the transistor array in the bandgap voltage reference circuit of FIG. 2a, in accordance with an embodiment of the present disclosure.

FIG. 2b illustrates a simulation or characterization plot that shows the dependency of base-emitter voltage shift on positions of the transistor array in the bandgap voltage reference circuit of FIG. 2a, in accordance with an embodiment of the present disclosure. As can be seen, the base-emitter voltage shift with respect to transistor $Q_1$ ($V_{BE1\text{-}shift}(T)$) at a first die position is different than the base-emitter voltage shift with respect to transistor $Q_2$ ($V_{BE2\text{-}shift}(T)$) at a second die position. The plot of FIG. 2b can be obtained, for example, from stress simulation (e.g., based on pre-fabrication modeling) or characterization (e.g., based on post-fabrication testing) of a given integrated circuit package and die assembly mounted on a given PCB, or a combination of such simulation and characterization (e.g., where simulated data is refined by actual data). In any case, the plot shows how the different distances of the two arrays from the centerline of the die causes a base-emitter voltage shift.

This positional-dependence of base-emitter voltage shift can be used in a beneficial manner. For instance, in some example embodiments, by placing all of the M transistors of $Q_1$, along with some of the N transistors of $Q_2$, at a first location proximate to the edge of the die (e.g., within 50 μm to 250 μm of the edge of the die), and placing the remainder of the N transistors of $Q_2$ at a second location in the middle region of the die (e.g., within 250 μm of the die center point), the absolute base-emitter voltage shift can be cancelled or otherwise reduced by a relative base-emitter voltage shift between the first and second locations, to keep the shift in the voltage reference ($\Delta V_{ref}$) negligible or otherwise within a desired tolerance. This cancelling effect can be represented as shown in Equations 4 and 5, wherein $V_{BE1\text{-}shift}(T)$ represents the absolute base-emitter voltage shift, and $V_{BE1\text{-}shift}(T)-V_{BE2\text{-}shift}(T)$ represents the relative base-emitter voltage shift.

$$\Delta V_{ref} = V_{BE1\text{-}shift}(T) - (V_{BE1\text{-}shift}(T) - V_{BE2\text{-}shift}(T))\frac{R_{tot}}{R_{ptat}} \quad \text{(Equation 4)}$$

$$R_{tot} = R_2 \quad \text{(Equation 5)}$$

Note that the first and second locations of the array can be selected based on the plot of FIG. 2b and Equation 4, according to some embodiments. For instance, in one example case, assume that $\Delta V_{ref}$ is 0 volts (+/− an acceptable tolerance) and the first location of the array is known. The first location can be, for instance, the original location of the array prior to any distribution of that array. Thus, the distance of that first location from the die centerline can be used to identify the $V_{BE1\text{-}shift}$ value that corresponds to that distance (as indicated by the FIG. 2b plot). With the values of $\Delta V_{ref}$ and $V_{BE1\text{-}shift}$ in hand, Equation 4 can be solved for the $V_{BE2\text{-}shift}$ value. Then, the second location can be determined by finding the centerline pointwise distance of the plot of FIG. 2b that corresponds to the resulting $V_{BE2\text{-}shift}$ value. Such a process can be used to establish the first and second locations of the array for the example configurations such as those shown in FIGS. 2d-g. In some cases, such as for the example configuration of FIG. 2c, tuning can be carried out where the individual transistors making up $Q_1$ or $Q_2$ are split between the first and second locations, to provide a greater degree of flexibility with respect to the first and second locations, as will be discussed with reference to FIG. 3c.

Variations will be apparent, such as the previously mentioned example case where there is a resistor Rb between ground and the emitters of $Q_1$ and $Q_2$, wherein $$R_{tot} = R_2 + \left(1 + \frac{R_2}{R_1}\right)R_b.$$

Also, note that the summing circuit that sums a scaled version of $\Delta V_{BE}$ with $V_{BE}$ to generate a temperature-stable $V_{ref}$ can be implemented with any number of summing circuits configured to establish the sum of $V_{ref}$ as $V_{BE} \Delta V_{BE}$ $(R_2+R_1)/R_2)$, whether it be an operational amplifier configured with negative feedback (such as the example of FIGS. 2a, 3a-c, 6a, and 6c), or a transistor (such as shown with $Q_3$ in FIG. 6b), or any other circuit configured to sum the opposing temperature coefficient values $\Delta V_{BE}$ PTAT and $V_{BE}$ CTAT, as will be appreciated in light of this disclosure.

So, a base-emitter voltage shift depends on the amount of mechanical stress on the individual transistors making up the array, and that mechanical stress has a position dependency on a die surface. To this end, the base-emitter voltage shift can be predicted by a stress simulation or characterization of the die as shown in FIG. 2b. In particular, an absolute shift of $Q_1$ (first term of Equation 4) can be cancelled or offset by a relative shift between $Q_1$ and $Q_2$ (second term of Equation 4) by selectively positioning the individual transistors of the array to achieve the cancellation effect. For instance, consider the example case where the stress profile of the die is symmetric, such that stress is greatest at center of the die and decreases with radial distance from center. In such cases, the different distance of each array from the centerline of die provides a different stress. This arrangement is more generally referred to as the difference of centerline pointwise distances of the two arrays, in FIGS. 2b and 10a. In any such cases, this selective positioning entails providing a first array of one or more transistors at a first location and a second array of one or more transistors at a second location, as will now be further discussed with reference to FIGS. 2c-g.

Figure 2C:
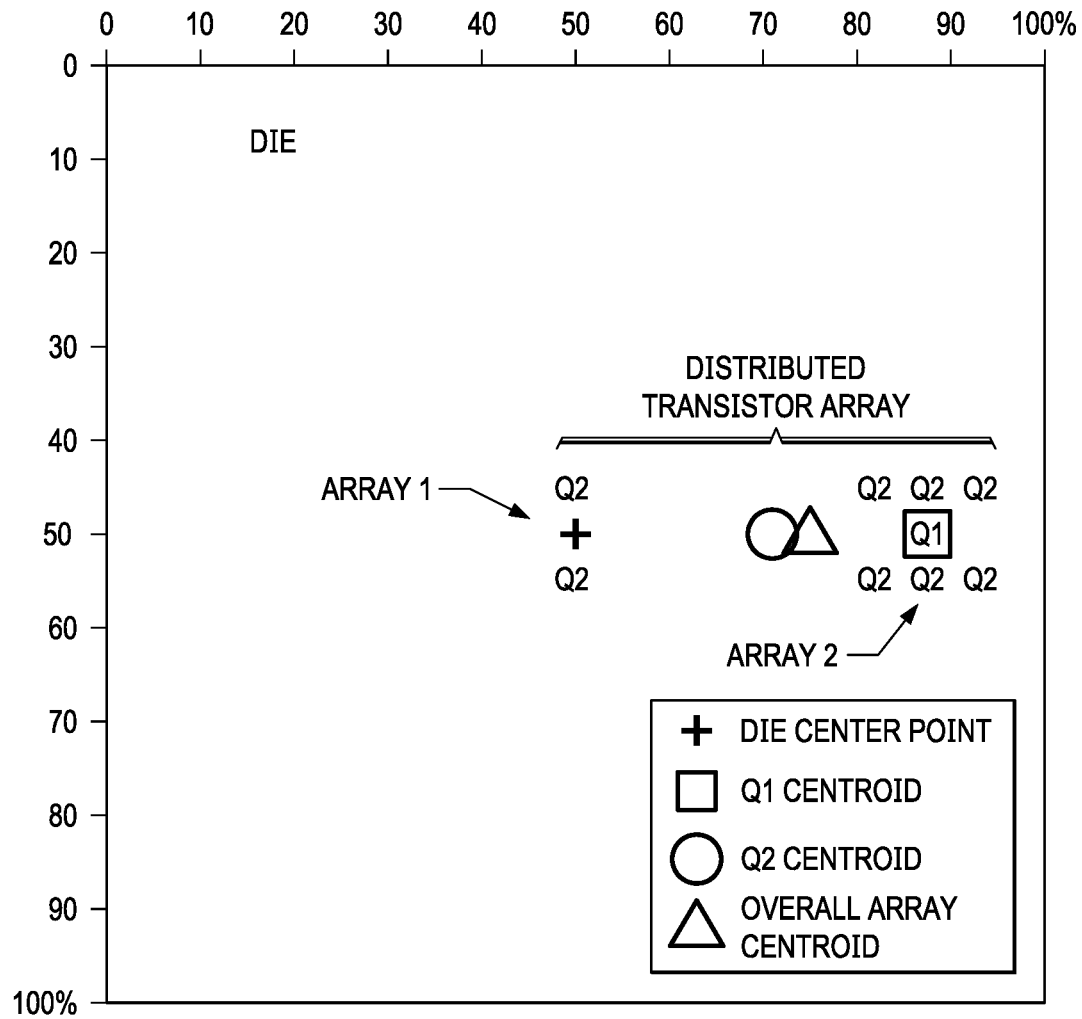
FIGS. 2c-g each illustrates an example of the distributed nature of the transistor array of the bandgap voltage reference circuit of FIG. 2a, in accordance with an embodiment of the present disclosure.

As can be seen in the example case of FIG. 2c, a rectangular die includes a distributed array. The array is distributed, in that it includes two distinct and spaced portions, designated as array 1 and array 2. As can further be seen, arrays 1 and 2 are used to form transistors $Q_1$ and $Q_2$. In particular, transistor $Q_1$ is formed with a single individual transistor of array 2, and transistor $Q_2$ is formed with a parallel connection of two individual transistors of array 1 and six individual transistors of array 2. Arrays 1 and 2 may be, for example, two distinct and separately formed arrays, or sub-arrays of one single large array. Alternatively, these array portions can simply be individual transistors formed in the respective locations shown. For purposes of this discussion, assume they are two distinct and separately formed arrays. For instance, array 1 may be a 3-by-1 array with a middle dummy cell, and array 2 may be a 3-by-3 array with two dummy cells in the middle row to either side of the single $Q_1$ transistor. As will be appreciated, a dummy cell (or dummy device) is an individual transistor of the array that is not connected into or otherwise part of the active circuit. In any case, note that the respective centroids of $Q_1$, $Q_2$, and the overall array are spaced from one another, wherein the centroid for $Q_1$ is shown with a bolded square, the centroid for $Q_2$ is shown with a bolded circle, and the centroid for the overall array is shown with a bolded triangle. As can be seen, the centroid of $Q_1$ is spaced from the centroid of $Q_2$ by about 16.5% of the die length (as measured from the center of the bolded circle to the center of the bolded square), and the centroid of the overall array is between those two centroids. In some such embodiments, each of the centroids lies along an imaginary horizontal line that passes through the die center point, and wherein surface stress of the die along the imaginary line near the center point is greater than surface stress of the die along the imaginary line near the edge. Thus, the surface stress imparted on the individual transistors of array 1 is greater than the surface stress imparted on the individual transistors of array 2. Other embodiments may have different stress profiles.

Figure 2D:
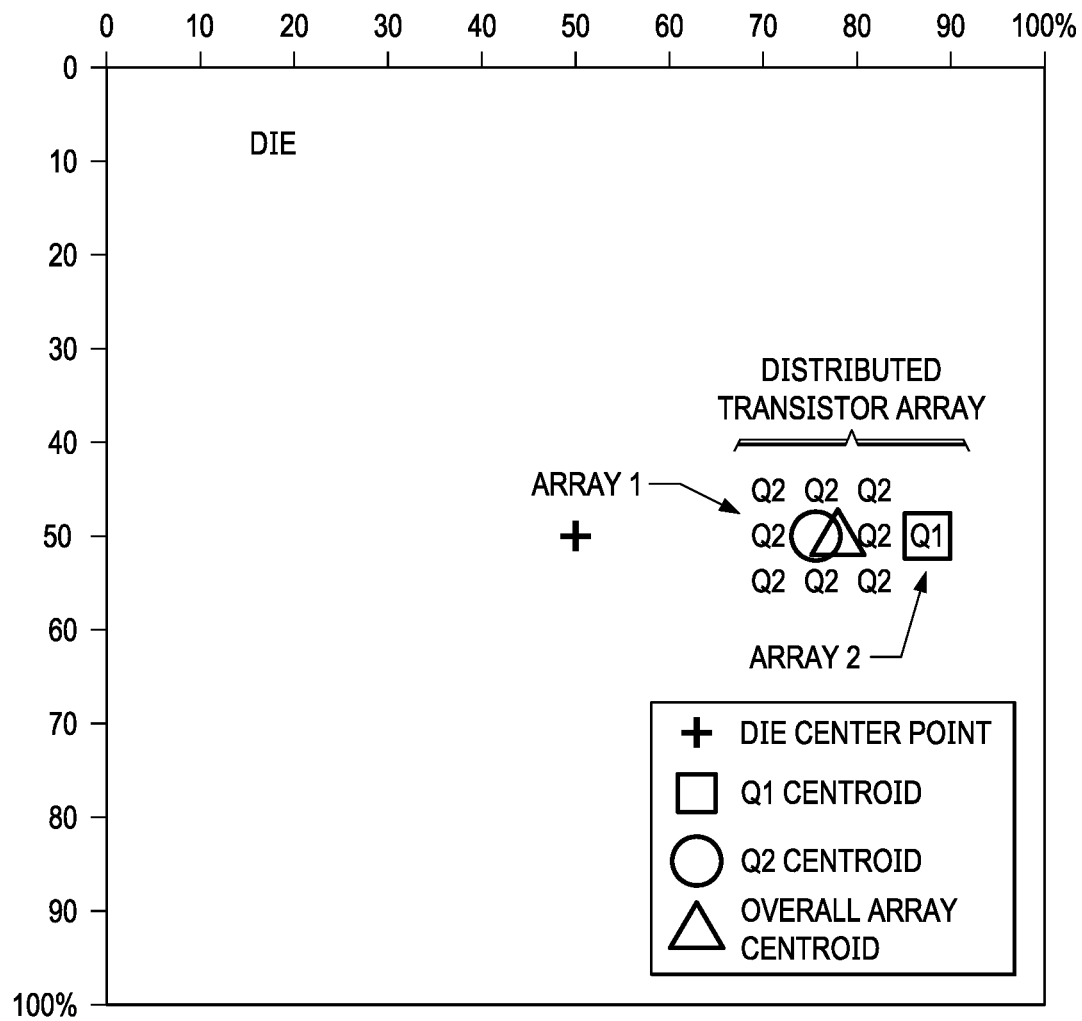

The example case of FIG. 2d is similar to that of the example case shown in FIG. 2c, except that array 1 is closer to array 2, and array 2 includes a single individual transistor for $Q_1$. The previous relevant discussion with respect to FIG. 2c equally applies here. As can be seen, the centroid of $Q_1$ is spaced from the centroid of $Q_2$ by about 13% of the die length (as measured from the center of the bolded circle to the center of the bolded square), and the centroid of the overall array is between those two centroids, but favoring the centroid of $Q_2$. In some such embodiments, each of the centroids lies along an imaginary horizontal line that passes through the die center point, and wherein surface stress of the die along the imaginary line near the center point is greater than surface stress of the die along the imaginary line near the edge. Thus, the surface stress imparted on the individual transistors of array 1 is greater than the surface stress imparted on the individual transistor of array 2.

Figure 2E:
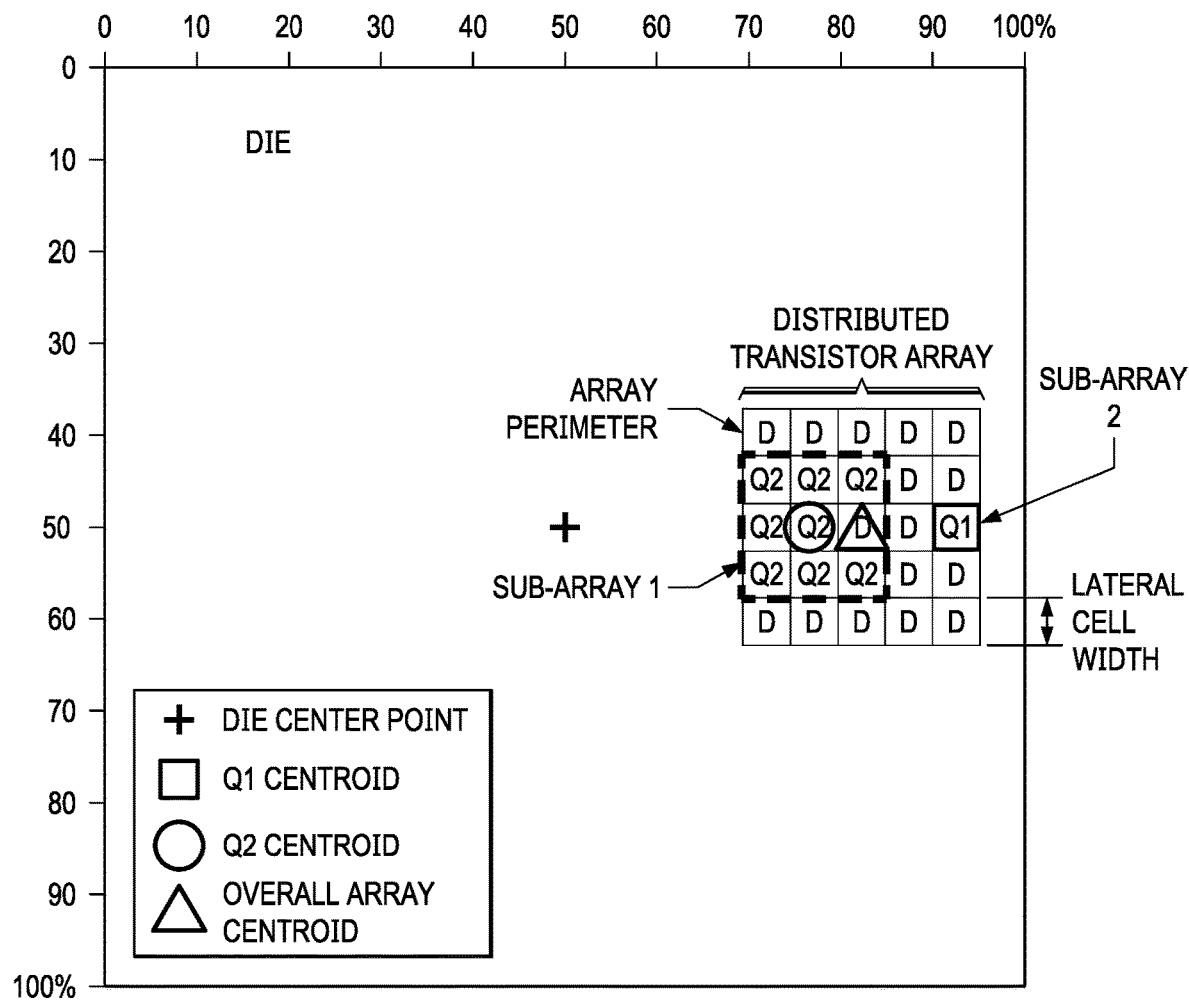
Figure 2F:
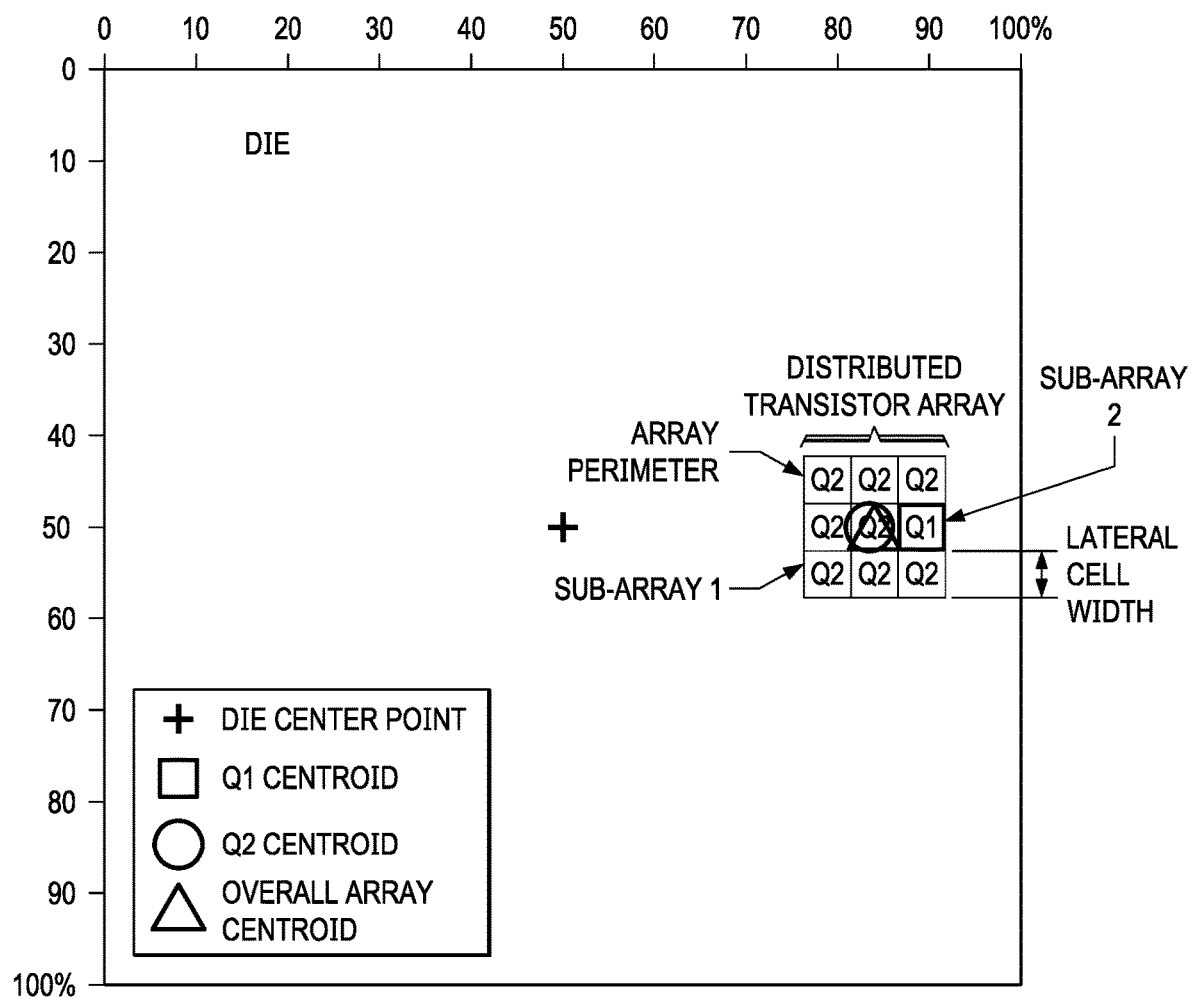

FIGS. 2e-f each illustrates an example case where the distributed array includes two sub-arrays that are part of an overall larger array.

In the distributed transistor array of FIG. 2e, the two sub-arrays are distributed in that they are spaced from one another by an array of dummy cells. In more detail, transistor $Q_1$ is formed with a single individual transistor of sub-array 2 which can be a single individual transistor or a 3-by-1 array (including two dummy cells) or a 5-by-1 array (including four dummy cells), and transistor $Q_2$ is formed with a parallel connection of eight individual transistors of sub-array 1 which can be a 3-by-3 array (generally designated with a dashed border and including one dummy cell) or 5-by-3 array (including seven dummy cells). As can be further scene, sub-array 1 is spaced from sub-array 2 by an intervening column of dummy cells, which can be thought of, for instance, as a 5-by-1 array of dummy cells. Thus, the distance between the facing edges of sub-array 1 and sub-array 2 is about the lateral width of a dummy cell device (e.g., 50 µm to 100 µm, in some embodiments). Further note that, like the example embodiments shown in FIGS. 2c-d, the respective centroids of $Q_1$, $Q_2$, and the overall array are spaced from one another, and that discussion is equally applicable here. In any case, the locations of the two sub-arrays can be selected based on the stress-delta between those two locations. In some such embodiments, the selection process can be guided using the corresponding plot of FIG. 2b and Equation 4, as previously explained. As can be seen, the centroid of $Q_1$ is spaced from the centroid of $Q_2$ by about 15% of the die length (as measured from the center of the bolded circle to the center of the bolded square), and the centroid of the overall array is between those two centroids. In some such example embodiments, each of the centroids lies along an imaginary horizontal line that passes through the die center point, and wherein surface stress of the die along the imaginary line near the center point is greater than surface stress of the die along the imaginary line near the edge. Thus, the surface stress imparted on the individual transistors of sub-array 1 is greater than the surface stress imparted on the individual transistor(s) of sub-array 2.

In the distributed transistor array of the die of FIG. 2f, the two sub-arrays abut each other, such that there is no dummy cell between them. However, note that the overall array is distributed in that their respective centroids of the sub-arrays are spaced from one another, according to an embodiment of the present disclosure. In more detail, transistor $Q_1$ is formed with a single individual transistor of sub-array 2, and transistor $Q_2$ is formed with a parallel connection of eight individual transistors of sub-array 1. As can be seen, the centroid of $Q_1$ is spaced from the centroid of $Q_2$ by about 5.1% of the die length (as measured from the center of the bolded circle to the center of the bolded square), and the centroid of the overall array is between those two centroids.

Figure 2G:
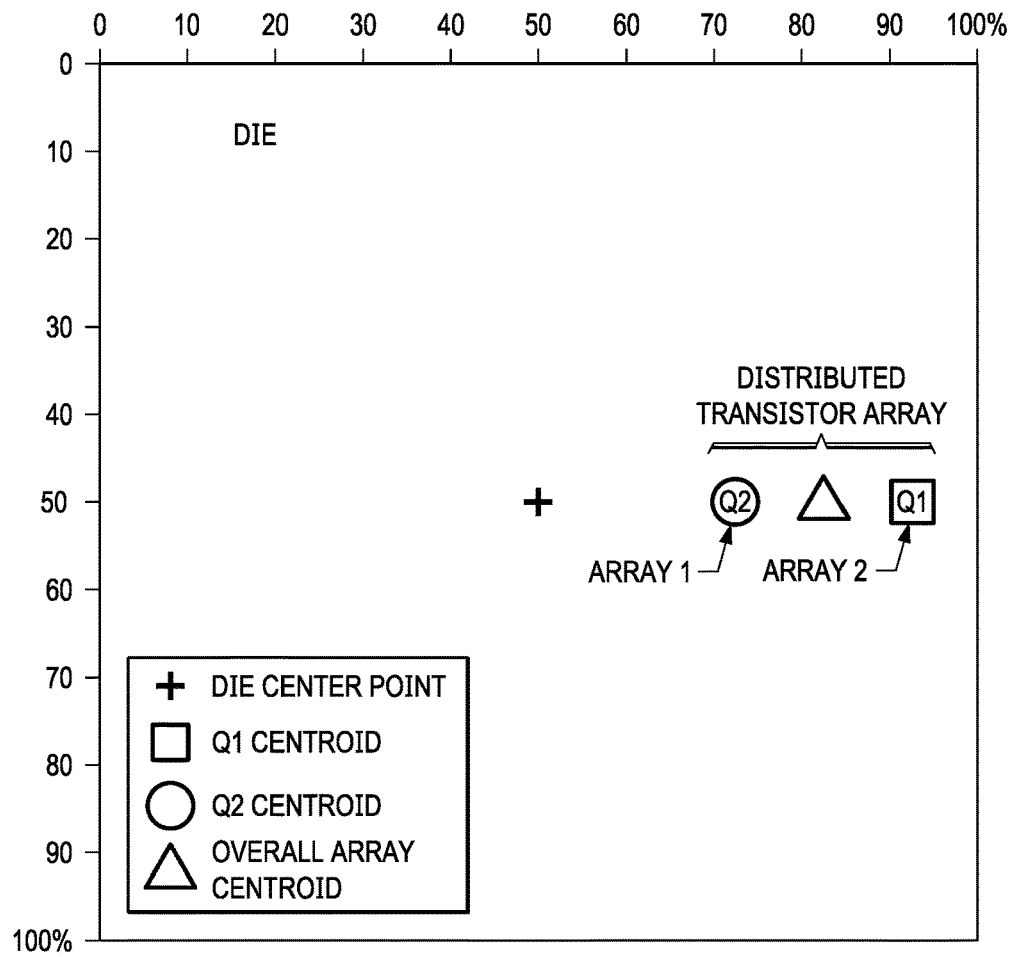

FIG. 2g illustrates an example case where the distributed array includes two distinct and spaced portions, designated as array 1 and array 2, with each array including a single individual transistor. In such a case, where M and N both equal 1, the current density can be set by the ratio of $R_2/R_1$, as will be appreciated. As can be seen, the centroid of $Q_1$ is spaced from the centroid of $Q_2$ by about 20% of the die length (as measured from the center of the bolded circle to the center of the bolded square), and the centroid of the overall array is between those two centroids. As with the other example embodiments, the locations of the two arrays can be selected based on the stress-delta between those two locations, given the overall stress profile of the die, whether that stress profile is symmetric (e.g., stress is greatest at center of the die and decreases with radial distance from center) or asymmetric (e.g., stress is greatest at a location offset from the center of the die and does not necessarily decrease with radial distance from that location). In some such embodiments, each of the centroids lies along an imaginary horizontal line that passes through the die center point, and surface stress of the die along the imaginary line near the center point is greater than surface stress of the die along the imaginary line near the edge. Thus, the surface stress imparted on the individual transistor of array 1 is greater than the surface stress imparted on the individual transistor of array 2.

Further note that in any such embodiments, the spacing between centroids can vary, such as some cases where the centroid of $Q_1$ is spaced from the centroid of $Q_2$ by about 1.5% of the die length, or 2% of the die length, or 3% of the die length, or 4% of the die length, and so on, up to about 50% of the die length, assuming a relatively symmetric stress profile such as the case where stress is greatest at center region of die and decreases as the radial distance from the center increases. In some example cases, the distance between the centroids of $Q_1$ and $Q_2$ is in the range of 5 µm to 500 µm (or more, such as the example cases where one centroid is proximate the center point of a relatively large die and the other centroid is proximate to the edge of that die, to provide distances between the centroids of $Q_1$ and $Q_2$ in excess of 1000 µm, or about up to about one-half the lateral width of the die). The centroid of the overall array will generally be between those two centroids, and favor the centroid associated with the greater mass (e.g., the device with the most individual transistors connected in parallel, or the largest emitter).

As will be appreciated, the term centroid as used herein is with respect to electrical characteristics but is understood as being analogous to centroid of mass and is a common terminology in analog layout practice. With a common centroid layout such as shown in FIGS. 1c-d, the general idea is to average linear processing gradients that impact the transistors' electrical properties. In practice, common centroid layouts have the centroid (center of mass) of each transistor positioned at the same location. In contrast, a distributed array as provided herein has non-common centroids which are spaced apart from one another. As noted above, the spacing between centroids can vary from one embodiment to the next, but in some embodiments is relatively small, such as in the range of 50 µm to 100 µm. Note that the spacing between centroids can be about the same as the lateral width of a single array cell (FIG. 2e), or even less than that width (FIG. 2f), in some embodiments.

As will be further appreciated, the reason that a standard bandgap voltage reference circuit utilizes a common centroid array is because there is a longstanding belief that arrays with a common centroid are necessary for initial matching and production variability. To this end, using a bandgap voltage reference circuit configured with a non-common centroid array as variously provided herein yields surprising results. An embodiment of the present disclosure is less sensitive to initial matching and production variability, since the spacing and configuration of the array can be tuned, as discussed herein. Further note that, only when the absolute stress shift of the $V_{BE}$ is considered with the package variable (solder-down stress impact on $V_{BE}$), can the offset in centroids (of the array) and consistent gradient stress profile (of the die) be taken advantage of, as explained herein.

Note that an array where the centroid of $Q_1$ is spaced from the centroid of $Q_2$ as variously described herein is detectable by inspection. For instance, according to some embodiments, $Q_1$ and $Q_2$ could be traced to their separate base and emitter connections to differentiate them within an array. The spacing between the centroids would be relative to the stress gradient effect. Knowing the connections, the non-common centroid layout would be apparent. The effect is greater with greater space.

Figure 3A:
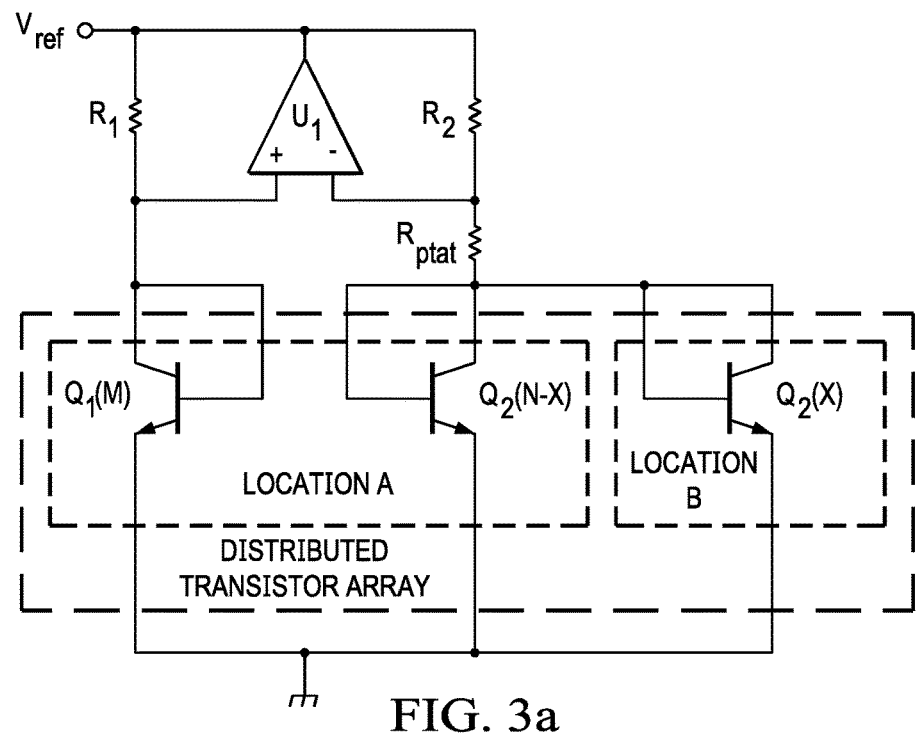
FIGS. 3a-c each illustrates further details of an example bandgap voltage reference circuit configured with a spatially distributed transistor array, in accordance with an embodiment of the present disclosure.
Figure 3B:
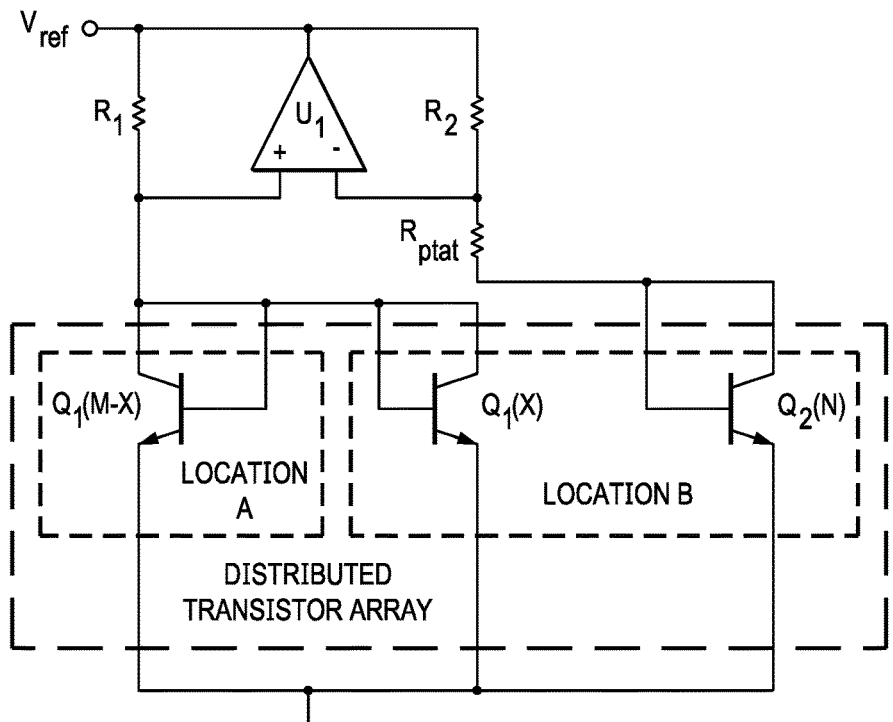
Figure 3C:
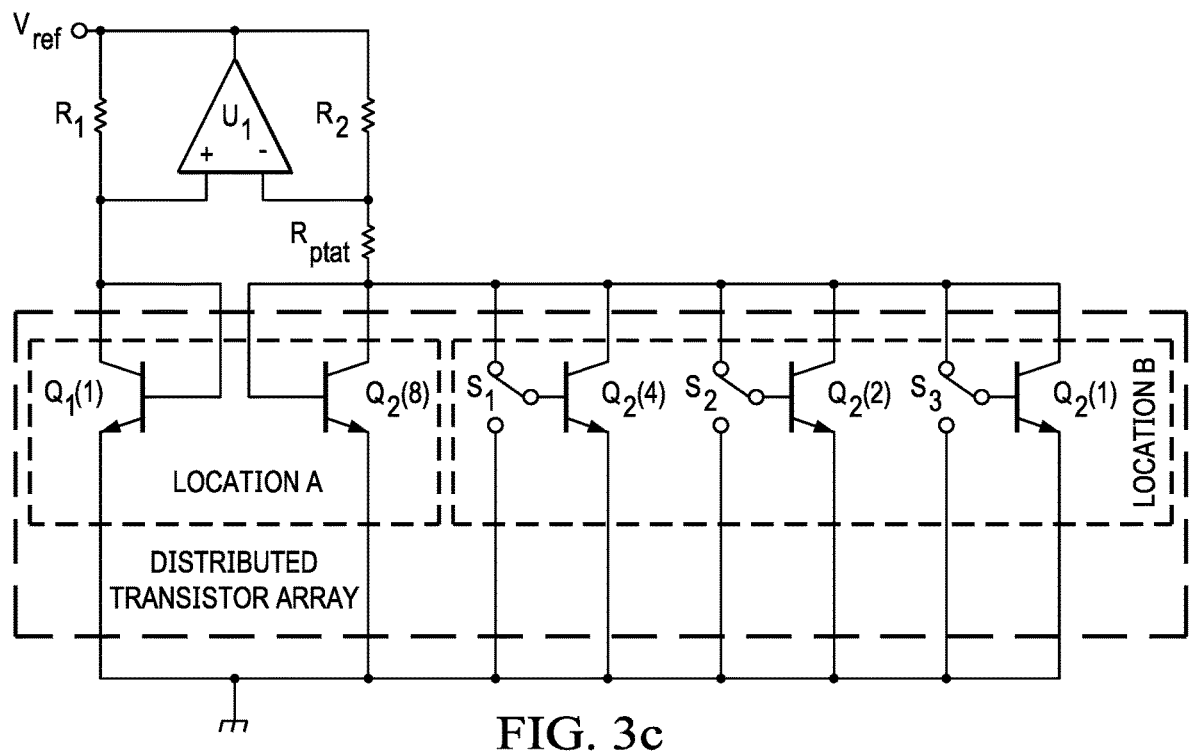

FIGS. 3a-c each illustrates further details of an example bandgap voltage reference circuit configured with a spatially distributed transistor array, in accordance with an embodiment of the present disclosure. As can be seen in each example configuration, the transistors making up the array are distributed such that some of the transistors are at location A of the die and the rest of the transistors are at location B of the die. In the example embodiment of FIG. 3a, the M transistors of $Q_1$ are all located at location A, and the N transistors of $Q_2$ are split between locations A and B. In this example case, note that: M, N, and X are integers; M is 1 or higher; N is 2 or higher; and X is N−1 or lower. Some example configurations have any of the following integer values: M=1 to 8; N=8 to 24; and X=1 to 23. Note these example ranges are not intended to limit the present disclosure; rather, the values of M, N, and X can vary from one embodiment to the next as will be appreciated, including embodiments where M and/or N are higher, or where M and N are both 1 and X is 0 (such as shown in FIG. 2g). Further examples are discussed with reference to FIG. 5.

In the example embodiment of FIG. 3b, the M transistors of $Q_1$ are split between locations A and B, and the N transistors of $Q_2$ are all located at location B. In this example case, note that: M, N, and X are integers; M is 2 or higher; N is 1 or higher; and X is M−1 or lower. Some example configurations have any of the following integer values: M=8 to 24; N=1 to 8; and X=1 to 23. Again, note these example ranges are not intended to limit the present disclosure. Further note that, as previously explained, the two differently-stressed locations in the configurations of FIGS. 3a-c may be along an imaginary straight line that passes through the center point of the die, but they need not necessarily be so arranged, as will be further discussed in turn with reference to FIGS. 4c and 10b.

As previously explained with reference to FIGS. 2c-g, the first and second locations of the array can be selected based on the corresponding plot of FIG. 2b and Equation 4, according to some embodiments. In some cases, such as for the example configuration of FIG. 2c, tuning can be carried out where the individual transistors making up $Q_1$ or $Q_2$ are split between the first and second locations. Such a configuration might be helpful, for instance, where one or both of the locations determined from the plot of FIG. 2b and Equation 4 are rough estimates or unavailable (e.g., because other circuits occupy those locations). To this end, FIG. 3c shows a specific implementation of the embodiment shown in FIG. 3a, which allows for selectively adding individual transistors at location B to tune based on characterization (actual performance data of fabricated circuit).

In more detail, and according to an embodiment, the corresponding plot of FIG. 2b is obtained, either from stress simulation and/or past characterization of the device. As will be appreciated, stress simulation is performed on a simulation tool to determine the estimated FIG. 2b plot, by modeling actual behavior for a given assembly. Such simulations can be performed before manufacturing a device to establish a baseline of the expected values in the actual device. Characterization, on the other hand, is based on a measurement of the actual device and thus is performed after the given device is manufactured device. In this latter case of characterization, tuning elements can be provided at least in the initial die design to allow for post-manufacturing tuning of the die performance. Example tuning elements include, for instance: switches (e.g., to electronically switch one or more individual transistors into or out of the array circuit); wire bonds (e.g., where a plurality of individual transistors are all initially connected into the circuit via wire bonds, and wire bonds for those transistors not needed are broken to remove those transistors from the functional array circuit); and breakable links (e.g., where the plurality of individual transistors are all initially connected into the circuit via links, and links for those transistors not needed are ablated, blown or otherwise broken to remove those transistors from the functional array circuit), to name a few examples.

In any case, with the FIG. 2b plot in hand and Equation 4 in hand, the two array locations A and B are identified to cancel the stress delta. Assume location A is the current location of the array to be distributed. By splitting the number of $Q_2$ transistors between location A and B as shown in FIGS. 3a and 3c, the $V_{BE2\text{-}shift}$ can be adjusted or fine-tuned by the interpolation. For purposes of a simulation, the value of X (the number of $Q_2$ transistors to be moved from location A to B can be determined, for example, by representing each individual transistor at both locations A and B by a voltage source. Then, one or more of the voltage sources of one location can be moved to the other location, and the simulation can be rerun until the desired level of stress delta cancellation is achieved.

For purposes of characterization, the value of X can be determined using tuning elements, as shown in the example of FIG. 3c. As can be seen, the example bandgap voltage reference circuit of FIG. 3c is similar to the circuit of FIG. 3a, except that it includes tuning elements (switches in this case) that can switch in different portions of the $Q_2$ transistor at location B, to arrive at the desired value of X, in in accordance with an embodiment of the present disclosure. In more detail: switch $S_1$ is used to switch in (or out) a parallel combination of four individual transistors for the location B portion of the $Q_2$ transistor; switch $S_2$ is used to switch in (or out) a parallel combination of two individual transistors for the location B portion of the $Q_2$ transistor; and switch $S_3$ is used to switch in (or out) a single individual transistor for the location B portion of the $Q_2$ transistor. Each of switches $S_1$, $S_2$, and $S_3$ can be controlled to connect the base of its respective transistor(s) to either (1) ground to effectively remove the transistor(s) from the functional circuit, or (2) the collector of that transistor(s) to place the transistor(s) in the functional circuit. In the current configuration, switch $S_1$ connects the parallel combination of four individual transistors for the location B portion of the $Q_2$, and both switches $S_2$ and $S_3$ switches are switched to ground to remove their respective transistors from the functional circuit. The circuit can then be tested to see if the desired level of stress delta cancellation is achieved. If not, switches $S_1$, $S_2$, and $S_3$ can be controlled to the next permutation and the circuit can again be tested to see if the desired level of stress delta cancellation is achieved, and so on, until the desired level of stress delta cancellation is achieved or all switch combinations are exhausted (in which case a different set of switchable transistor portions can be implemented into the design, so the process can be repeated). Note that once the configuration that provides the desired level of stress delta cancellation is found, that configuration can be implemented without the switches if so desired. Other embodiments may use wire bonds or ablatable links to add in or remove the various location B portions of the $Q_2$ transistor, thereby allowing for some post-fabrication tuning. Numerous tunable embodiments will be appreciated.

In operation, with respect to the example topologies of FIGS. 3a-c, transistors $Q_1$ and $Q_2$ can be operated at different current densities to generate a current that is proportional to absolute temperature (PTAT) in resistor $R_{ptat}$ (or some other PTAT element, such as capacitor $C_1$ in FIG. 6c), and the resulting PTAT voltage across the PTAT element can be added to the complementary to absolute temperature (CTAT) voltage $V_{BE}$ of $Q_1$, thereby yielding a temperature-insensitive output voltage $V_{ref}$ at roughly the bandgap energy of the semiconductor material used to make the transistors. Note that the summing circuit adds the scaled PTAT voltage and the CTAT voltage in this example case is an op-amp configured with negative feedback. Resistors $R_1$ and $R_2$ can be selected to set the desired current through $Q_1$ and $Q_2$.

Figure 4A:
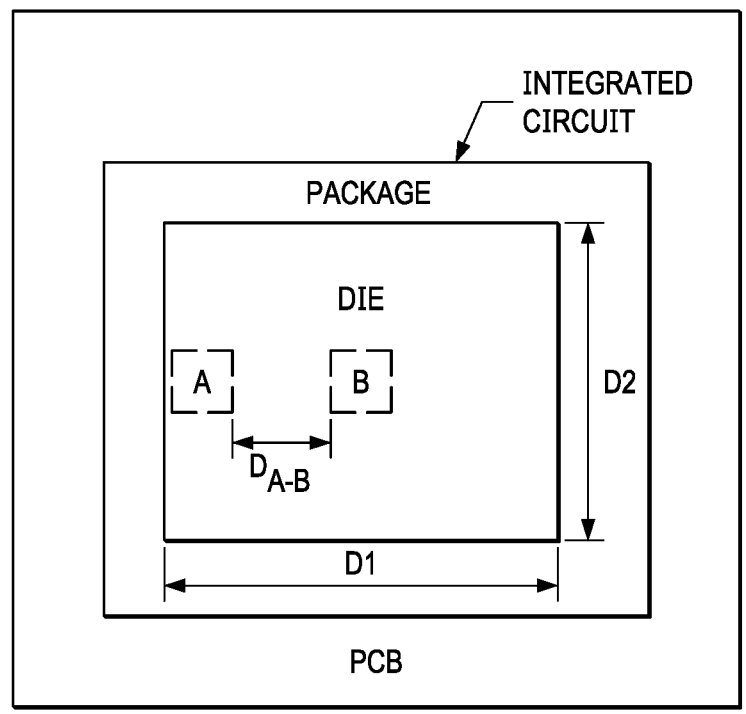
FIGS. 4a-c each illustrates an example electronics system having an integrated circuit that includes a bandgap voltage reference circuit configured with a spatially distributed transistor array, in accordance with an embodiment of the present disclosure.
Figure 4B:
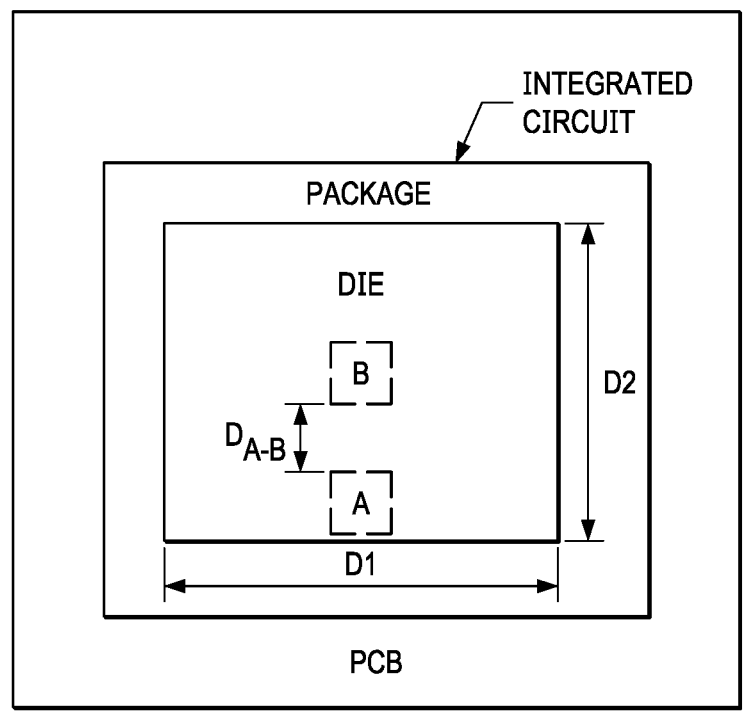
Figure 4C:
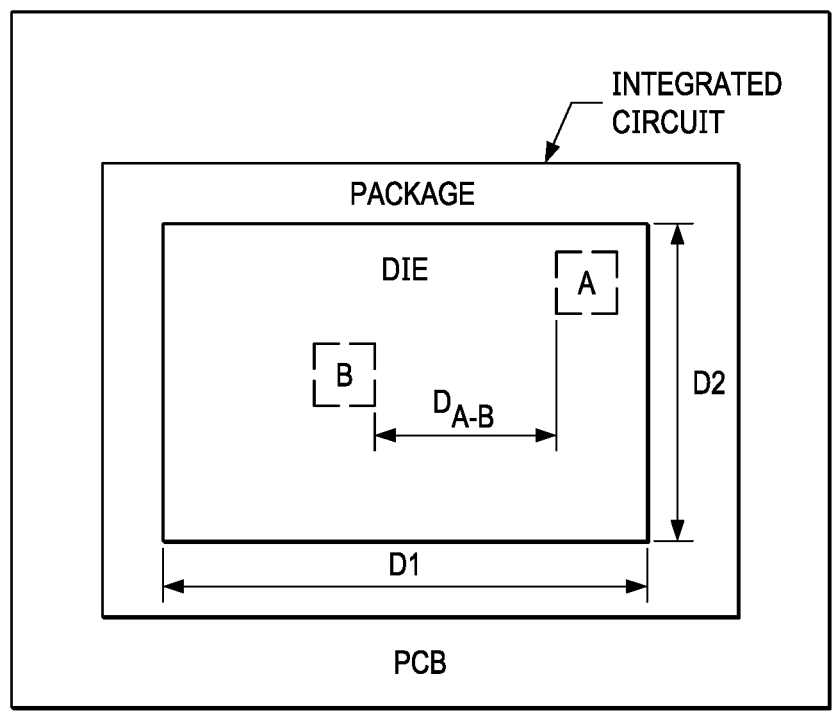

FIGS. 4a-c each illustrates an example electronics system having an integrated circuit that includes a bandgap voltage reference circuit configured with a spatially distributed transistor array, in accordance with an embodiment of the present disclosure. As can be seen, each of the example systems comprises an integrated circuit having a semiconductor die contained within a package that is soldered to a printed circuit board (PCB). The die thus has a stress profile which can be determined using standard die stress modeling techniques, and array locations are selected to exploit that profile, as variously described herein. The system may be any electronics system suitable for a given application, and the specific details of the PCB and integrated circuit will largely be defined by that application. Some example such applications are shown in FIGS. 11a-e. In any such cases, assume the application calls for a bandgap voltage reference. As will be appreciated, the present disclosure is not intended to be limited to any such particular example applications.

The PCB can be any standard or proprietary printed circuit board, such as one that includes copper pads and lines that form part of a circuit on a dielectric core. Integrated circuits and other discrete components (e.g., capacitors, inductors, resistors, displays, RF componentry, processors, controllers, digital logic devices) can be populated on the PCB to complete the circuit. In some example cases, the PCB may include multiple conductive patterned layers within a laminate structure, with metallized vias to connect features of one layer to the features of another layer. In a more general sense, the PCB can be any board suitable for coupling with the integrated circuit package via a solder-down process. The size and particular configuration of the PCB will vary from one embodiment to the next, depending on the application, as will be appreciated.

The integrated circuit package can be any standard or proprietary package. In some cases, the package is a QFN (Quad Flat No-lead) package that includes pads on its bottom surface that can be bonded with corresponding pads on the PCB, during a solder-down process. In other cases, the package is a dual inline or small outline package or pin grid array type package that includes leads that can be bonded to corresponding pads or holes on the PCB, during a solder-down process. In any such cases, the die is bonded or otherwise fixed within the package and electrically connected to input/output pads or leads within the package, which are in turn connected to the outer pads or leads of the package that couple to the PCB. The extra space within the package can be filled with molding compound to, for example, improve structural robustness of the integrated circuit.

As previously noted, the die can be implemented with any number of standard or proprietary semiconductor materials and process technologies, and with any number of circuits thereon, but generally includes a bandgap voltage reference circuit configured with a spatially distributed transistor array, as variously described herein. In some embodiments, the die is a system-on-chip configured to perform a set of specific functions (e.g., signal processing), but in other embodiments can be dedicated to one particular function (such as digital-to-analog conversion, power-on-reset, low-dropout linear regulator, or power conversion). In any such cases, the function(s) provided by the die utilize an internal temperature-stable voltage reference, which is provided by the bandgap voltage reference circuit configured with the distributed array. The die may further include other components that facilitate the functions of the chip, as will be appreciated.

As previously explained, each of the die (e.g., silicon, germanium, gallium arsenide, or other semiconductor material(s)), package mold compound, and PCB can have different coefficients of thermal expansion that create temperature dependent stress on the active p-n junction components (e.g., silicon BJTs) that are to generate a temperature-invariant voltage reference. The rigid attachment of the integrated circuit to PCB traces creates a boundary condition on that stress. Hence, a solder-down induced shift in output voltage of the reference circuit results, because of the mechanical stress imparted to the die, which is fixed within the package, which is fixed to the PCB.

As can be further seen in FIGS. 4a-c, the spatially distributed array in these example cases is positioned at two locations of the die, A and B. So, for instance, recall the distributed array of the example embodiment shown in FIG. 3a, where the M individual transistors of $Q_1$ are all at location A, and the N individual transistors of $Q_2$ are split between locations A and B; likewise, recall the distributed array of the example embodiment shown in FIG. 3b, where the M individual transistors of $Q_1$ are split between locations A and B, the N individual transistors of $Q_2$ are all at location B. Assume these particular example embodiments of FIGS. 4a-c are using two distinct and separately formed arrays, with each separate array having a perimeter or edge. The absolute spacing between the two arrays at locations A and B, respectively, is designated as $D_{A-B}$, and is from edge-to-edge in these example cases. As previously noted, this distance $D_{A-B}$ is more than the de minimis or otherwise relatively small spacing between individual transistors making up a non-distributed array.

Note that the differently-stressed array portions may be, according to some embodiments, along a horizontal line that passes through the center point of the die (FIG. 4a), or a vertical line that passes through the center point of the die (FIG. 4b), wherein location B is generally in the center point of the die and location A is proximate to an edge of the die. This is because, in some such embodiments, the mechanical stress imparted to the die by the solder-down process is greatest at the center point of the die and decreases with radial distance from the center point and thus lowest near the edge of the die, to provide a relatively symmetrical stress profile. In such cases, the distance of each array from the die center point is different, thereby imparting different stress on the arrays. However, the stress imparted to a given die can vary as will be appreciated and may not be the greatest at the center point of the die and lowest near the edge of the die in all cases. For example, in one such embodiment, the array portions may be, for instance, along a diagonal line that passes through two non-central regions of the die (FIG. 4c), wherein location B is laterally offset from the center point to favor the left side of the die and location A is proximate to the upper right corner of the die. To this end, the arrays need not necessarily be located along an imaginary horizontal or vertical line that passes through the center point of the die; rather, they could be located along an imaginary diagonal line that passes through an upper portion of the die, or a lower portion of the die, or a left portion of the die, or a right portion of the die, or so on, depending on the stress model of the given die.

The distance $D_{A-B}$ is a non-trivial distance, relative to the de minimis distance between individual transistors of a non-distributed array. For instance, distance $D_{A-B}$ is in the range of 1.5% to 65% of the major dimension of the die that runs in the same direction as the spacing, according to some embodiments. In more detail, and as can be further seen in FIGS. 4a-c, the die has a major dimension $D_1$ along the x-axis, and another major dimension $D_2$ along the y-axis. So, for example, in FIGS. 4a and 4c, the example spacing runs generally in the x-axis direction, and distance $D_{A-B}$ is 1.5% to 65% of $D_1$. In a similar fashion, in FIG. 4b, the example spacing runs in the y-axis direction, and distance $D_{A-B}$ is 1.5% to 65% of $D_2$. In some such embodiments, distance $D_{A-B}$ is in the range of 3% to 50% of the relevant major dimension ($D_1$ or $D_2$), or 5% to 45%, or 10% to 50%, or 20% to 40%. Note these example distances are not merely a matter of design choice. Rather, these example distances assume that stress is greatest in the middle region of the die. In such cases, note that locations A and B which are equidistant from the center of the die will likely not yield a cancelling benefit (because the stress will be substantially the same at both locations), as will be appreciated; rather, in such situations, a difference in distance of each array from the die center will yield differently-stressed locations and a cancelling benefit. That said, and as will be further appreciated, the techniques provided herein can also be used in cases where the stress is greatest in a non-middle region of the die, by forming some transistors of the array at the high stress region of the die and forming other transistors of the array at a relatively lower stress region of the die.

So, for instance, consider a square die where the major dimensions $D_1$ and $D_2$ are both 5000 µm. In some such embodiments, distance $D_{A-B}$ is in the range of 75 µm to 2500 µm, such as around 100 µm to 2250 µm (e.g., 200 µm, or 500 µm, 750 µm, 1000 µm, 1600 µm or 2000 µm from central location to edge location). As will be readily appreciated, the shape and major dimensions of a given die can vary greatly, and this example embodiment is not intended to limit the present disclosure to specific shapes or geometry. As will be further appreciated, proximate to an edge as used herein can vary depending on the major dimensions of the die. For instance, for a die that has a major dimension of 5000 µm, being proximate to the edge of that die means, for example, a location that is within 500 µm of the edge, or 10% or less of that major dimension from the edge, such as a location that is 50 µm to 250 µm from the edge of the die. Further note that process limitations may limit the proximity to the edge, as will be appreciated. Likewise, terms such as center region or central location as used herein can vary depending on the major dimensions of the die. For instance, for a die that has a major dimension of 5000 µm, being in the center region of that die means, for example, a location that is 10% or less of that major dimension within the center point of that die, such as location that is within 250 µm from the center point of the die. As will be further appreciated, the center point of the die is the geometric center of that die (e.g., geometric center of a rectangle-shaped die).

Further recall that the spacing between the two differently-stressed array portions can be thought of in a number of ways. For instance, the spacing between the two array portions can be thought of in the absolute sense as the edge-to-edge distance $D_{A-B}$ as depicted in FIG. 4a-c. In cases where mechanical stress imparted to the die by the solder-down process is greatest at the center region of the die and decreases with radial distance from the center region, the spacing between the array portions can be thought of in the relative sense as the distance of each array portion from the die center region, such as with the example of FIG. 10b. Similarly, in cases where mechanical stress imparted to the die by the solder-down process is greatest at some off-center region of the die and decreases with radial distance from the off-center region, the spacing between the array portions can be thought of in the relative sense as the distance of each array portion from that off-center region. And as discussed with reference to FIGS. 2c-g, the spacing between the array portions can be thought of in terms of the distance between the centroid of the active devices ($Q_1$ and $Q_2$) formed in the array. In any such cases, each of the two array portions is subjected to a different stress.

Figure 5:
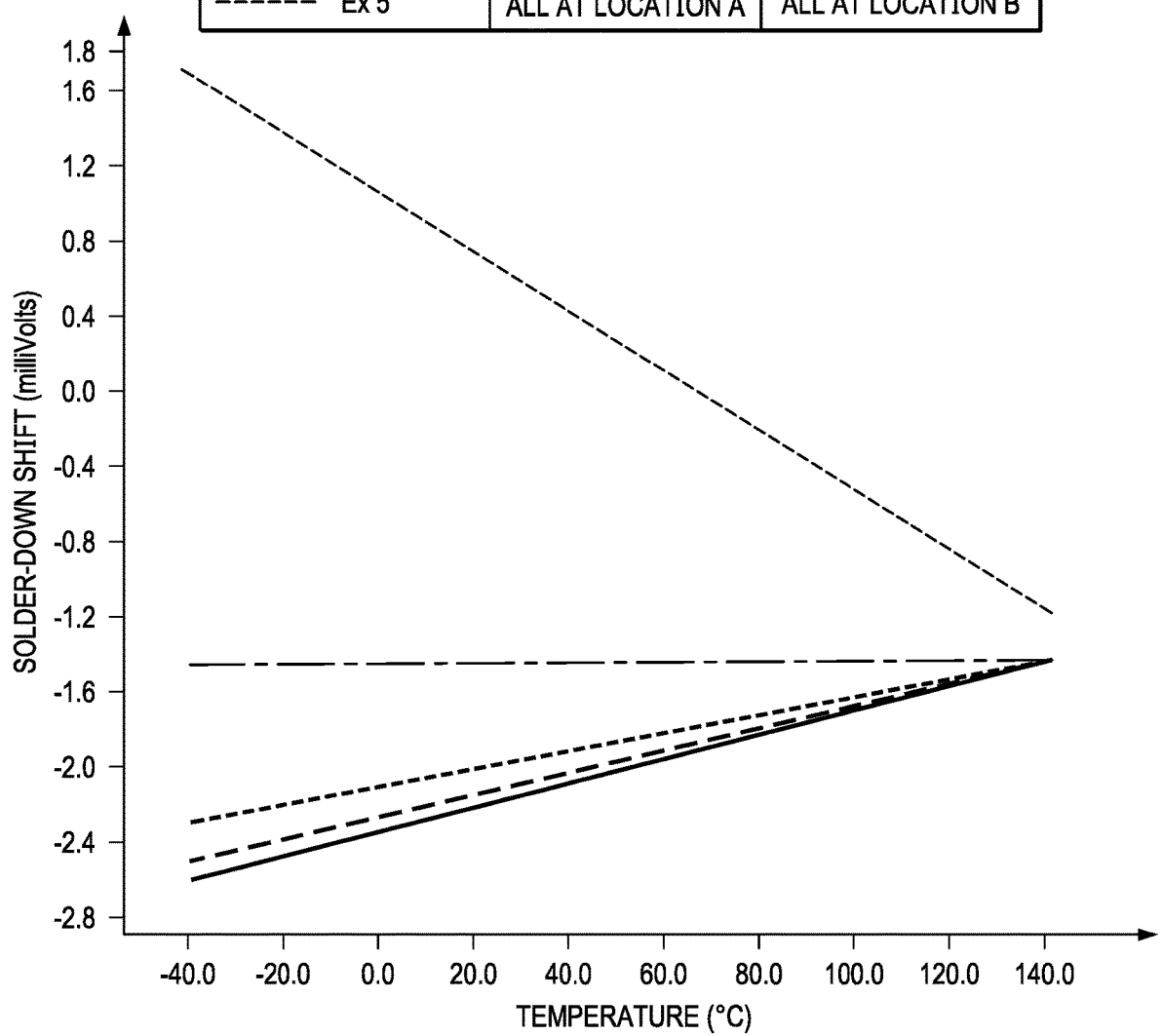
FIG. 5 illustrates further details of the dependency of solder-down induced voltage shift on transistor positions of a spatially distributed transistor array of various example bandgap voltage reference circuits each configured in accordance with an embodiment of the present disclosure, relative to bandgap voltage reference circuits having non-distributed transistor arrays.

FIG. 5 illustrates further details of the dependency of solder-down induced voltage shift on positions of a spatially distributed transistor array of various example bandgap voltage reference circuits each configured in accordance with an embodiment of the present disclosure, relative to bandgap voltage reference circuits having non-distributed transistor arrays. The transistors used for the five examples depicted are n-type BJTs, but other comparable p-n junction devices similarly positioned that would behave similarly can also be used, as will be appreciated. Further note that locations A and B can be, for instance, those depicted in FIGS. 2c-g or 4a-c or 10b, where location B experiences a higher degree of stress than location A. Further assume the bandgap voltage reference circuit configuration of FIG. 3a is being used for the simulations depicted in FIG. 5, and that M=2 and N=16, although such a specific configuration is simply one example.

As can be seen from the two lowest plots of FIG. 5, the example array configurations 1 and 2 (Ex 1 and Ex 2) are non-distributed, wherein all of the transistors of example array configuration 1 are at location B in the middle region of the die, and all of the transistors of example array configuration 2 are at location A proximate the edge of the die. Following these two respective plots from left to right, it can be seen that these non-distributed array configurations both exhibit an upward solder-down shift of about 1 millivolt over the temperature range of −40° C. to 140° C. Such a shift may be unacceptable for some applications, and thus mitigation of same can be beneficial.

As can be seen with respect to example array configuration 3 (Ex 3) of FIG. 5, all the M transistors of $Q_1$ along with one of the N transistors of $Q_2$ are at location A proximate the edge of the die, and the remaining balance of the N transistors of $Q_2$ are at location B in the middle region of the die. As can be seen by the corresponding plot, such a distributed array configuration exhibits about 25% to 30% improvement (mitigation) relative to the solder-down shift attributable to the non-distributed configurations, over the same temperature range. Thus, at least some degree of voltage output mitigation is provided by distributing transistors of the array, which is advantageous.

As can be seen with respect to example array configuration 4 (Ex 4) of FIG. 5, all the M transistors of $Q_1$ along with four of the N transistors of $Q_2$ are at location A proximate the edge of the die, and the remaining balance of the N transistors of $Q_2$ are at location B in the middle region of the die. As can be seen by the corresponding plot, such a distributed array configuration effectively cancels, neutralizes or substantially reduces the solder-down shift attributable to the non-distributed configurations, over the same temperature range. So, relative to the example array configuration 2 (Ex 2), and according to one specific embodiment of FIG. 3a where M=2 and N=16, by moving 12 of the 16 transistors of $Q_2$ into the middle position of the die, absolute shift is canceled out or otherwise reduced. Note in other embodiments, the mitigation effect may be achieved by moving a different number of the 16 transistors of $Q_2$ into the middle position, such as by moving 4. Further note that, in some such embodiments, as the distance between the two locations A and B increase, the fewer the number of the N transistors need to be moved to achieve the same cancellation effect. To this end, there is a continuum of discrete possibilities with the choice of X (number of transistors to move) and distance between locations, and the mitigation effect caused from moving transistors of the array from one location to another can be tuned accordingly for a given application.

As can be seen with respect to example array configuration 5 (Ex 5) of FIG. 5, all the M transistors of $Q_1$ are at location A proximate the edge of the die, and all N transistors of $Q_2$ are at location B in the middle region of the die. As can be seen by the corresponding plot, such a distributed array configuration exhibits a downward solder-down shift of about 3 millivolts, over the same temperature range. This example configuration shows that a wide range of compensation can be provided by fine tuning the number of transistors at each location of the distributed array.

Figure 6C:
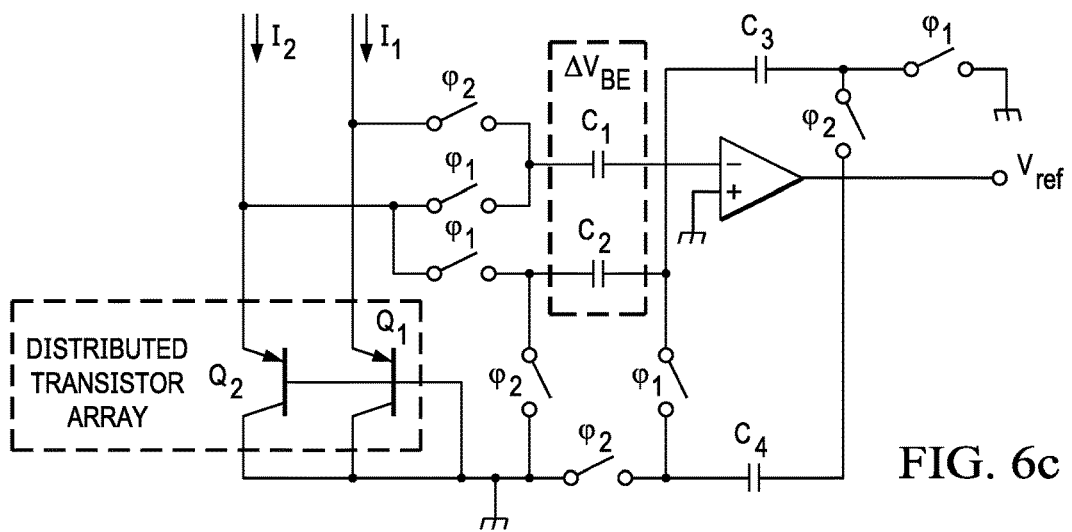

FIGS. 6a-c each illustrates another example bandgap voltage reference circuit configured with a spatially distributed transistor array, to mitigate base-emitter voltage shift over temperature due to mechanical stress induced by the solder-down process, in accordance with an embodiment of the present disclosure. As can be seen, a Brokaw topology is provided in FIG. 6a, a Widlar topology is provided in FIG. 6b, and a switched capacitor topology is provided in FIG. 6c. In any such cases, note that the distributed array techniques provided herein can be readily applied to the transistors $Q_1$ and $Q_2$, as will be appreciated. For instance, in the Brokaw topology of FIG. 6a, transistors $Q_1$ and $Q_2$ can be operated at different current densities ($Q_2$ has lower $V_{BE}$) to generate a voltage that is proportional to absolute temperature (PTAT) across resistor $R_2$, which can be added to the complementary to absolute temperature (CTAT) voltage $V_{BE}$ of $Q_1$, thereby yielding a temperature-insensitive output voltage $V_{ref}$ at roughly the bandgap energy of the semiconductor material used to make the transistors. Similarly, in the Widlar topology of FIG. 6b, transistors $Q_1$ and $Q_2$ can be operated at different current densities ($Q_2$ has lower $V_{BE}$) to generate a voltage that is proportional to absolute temperature (PTAT) across resistor $R_3$. The amplified version of this PTAT voltage drops across $R_1$, and is added to the complementary to absolute temperature (CTAT) voltage $V_{BE}$ of $Q_3$, thereby yielding a temperature-insensitive output voltage $V_{ref}$ at roughly the bandgap energy of the semiconductor material used to make the transistors. The switched capacitor topology of FIG. 6c shows an example case where the PTAT $\Delta V_{BE}$ element is capacitively coupled (via capacitors $C_1$ and $C_2$) with gain to the summing op-amp, rather than resistive like the example Brokaw and Widlar topologies. In any case, transistors $Q_1$ and $Q_2$ can be similarly operated at different current in conjunction with switching action to generate the PTAT and CTAT voltages, thereby yielding a temperature-insensitive output voltage $V_{ref}$ at roughly the bandgap energy of the semiconductor material used to make the transistors. Note that in any such cases, additional components may be used, such as buffering circuitry (e.g., unity gain buffer) to, for example, drive the PTAT element, or to drive the output of the bandgap voltage reference circuit. Numerous such variations will be apparent.

Figure 7:
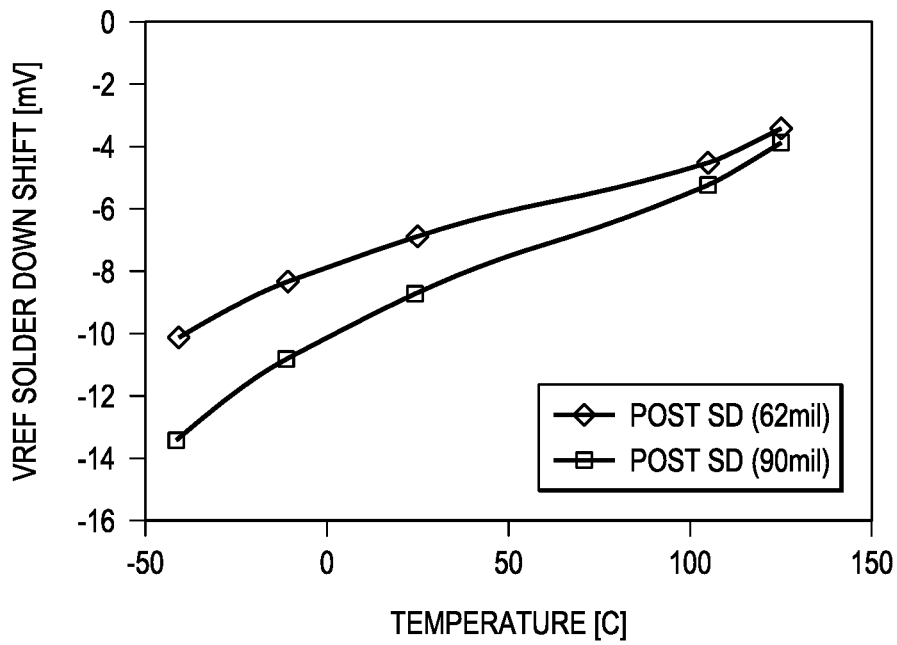
FIG. 7 illustrates the dependency of solder-down induced voltage shift on thickness of a printed circuit board of bandgap voltage reference circuits.

FIG. 7 illustrates the dependency of solder-down induced voltage shift on thickness of a printed circuit board of bandgap voltage reference circuits. As can be seen, two plots are shown, the upper one showing the solder-down induced shift in output voltage for a bandgap voltage reference circuit soldered to a first PCB having a first thickness (62 mils), and the lower one showing the solder-down induced shift in output voltage for a bandgap voltage reference circuit soldered to a second PCB having a second thickness (90 mils). All other things equal, note that the thicker the PCB, the greater the amount solder-down induced shift in output voltage for a bandgap voltage reference circuit. Thus, such a detail can be considered when designing and modeling a specific system.

FIG. 8 illustrates that both NPN and PNP transistors are similarly susceptible to solder-down induced voltage shift, when used in the transistor array of bandgap voltage reference circuits. Thus, while various example circuits provided herein are implemented with NPN transistors, it is apparent that such examples can also readily be implemented with PNP transistors and a similar benefit can still be achieved. To this end, the present disclosure equally applies to both NPN and PNP transistors.

Figure 9A:
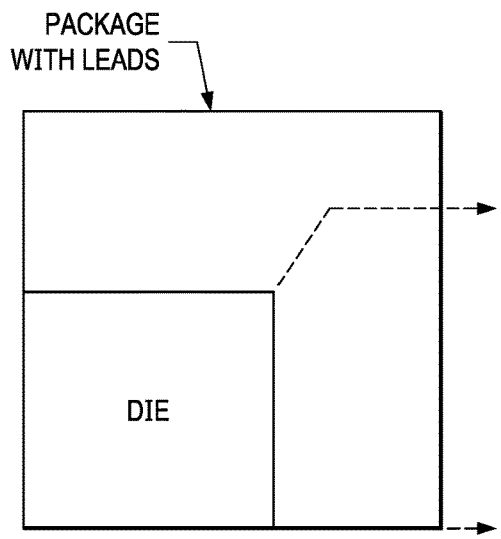
FIGS. 9a-c collectively illustrate mechanical stress on a die of an integrated circuit package, induced by the solder-down process.
Figure 9B:
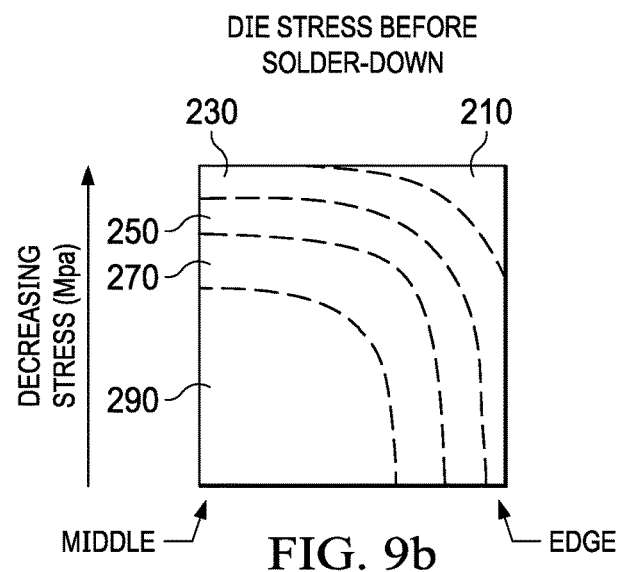
Figure 9C:
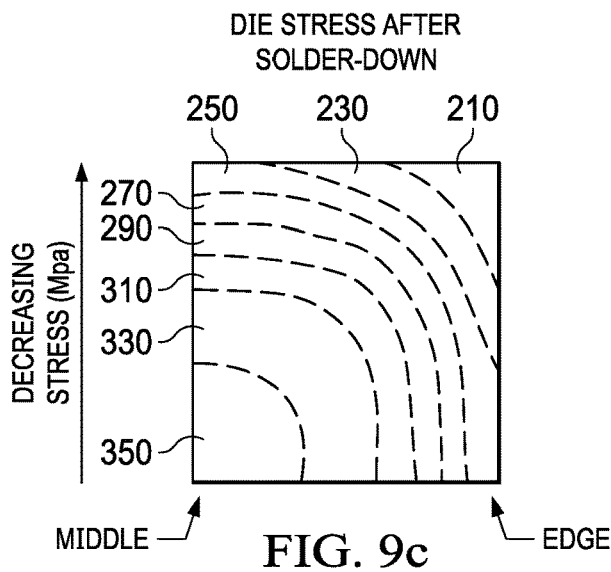

FIGS. 9a-c illustrates mechanical stress on a die of an integrated circuit package, induced by the solder-down process. As can be seen in FIG. 9a, an integrated circuit is provided that includes a package containing a die. Note that FIG. 9a depicts one-quarter of the given die's full size (the upper right quadrant, with respect to top down view). FIGS. 9b-c are simulations showing mechanical stress in the die, both before the solder-down process and after the solder-down process, respectively. While the absolute values of stress (mega-Pascals, MPa) will vary from one embodiment to the next, note a substantial increase in die stress post solder-down can manifest, particularly in the middle region of the die which in some simulations experiences a stress increase in the range of 50 to 100 MPa. For instance, in the example simulation shown, post solder-down stress at the middle of the die is about 60 MPa higher than before the solder-down process.

Figure 10A:
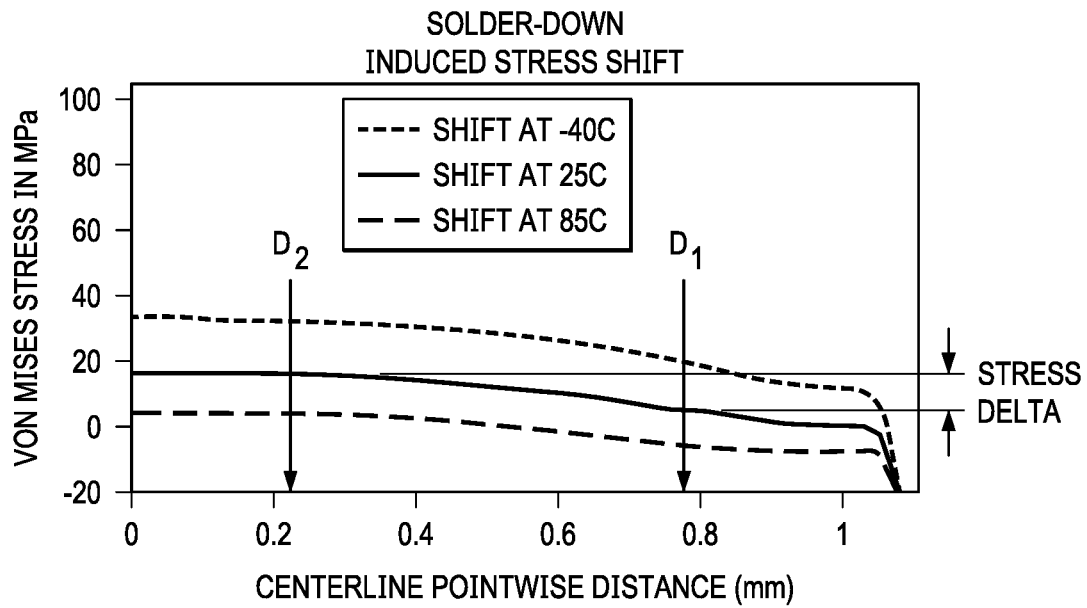
FIGS. 10a-b collectively illustrate how solder-down induced mechanical stress on a die is position-dependent and thus varies within the area of that die.
Figure 10B:
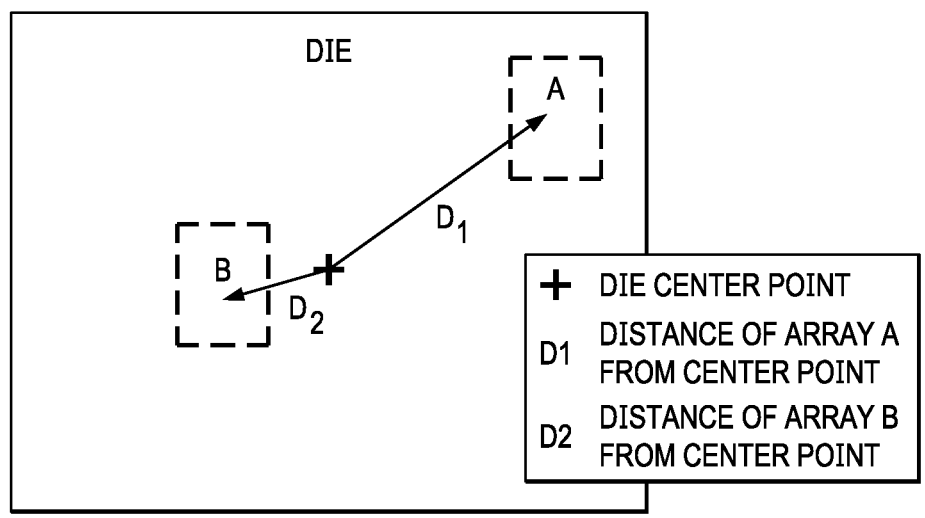

FIGS. 10a-b collectively illustrate how solder-down induced mechanical stress on a die is position-dependent and thus varies within the area of that die. As can be seen in FIG. 10a, package stress has a temperature dependency as well as position dependency. In particular, the stress tends to decrease as the distance from the center of the die increases, according to this example embodiment. Note the stress is measured as von Mises stress, in mega-Pascals, MPa, which is a theoretical measure of stress (same for the simulation shown in FIGS. 9a-c). Further note that the distance is in terms of absolute mm distance from the center of the die. Thus, symmetrical plots would result for distance from the die center in the opposite direction (to the other opposing edge of the die). By utilizing position dependency of package stress, the present disclosure provides a technique for reducing temperature coefficient shift of $V_{BE}$. So, it can be seen that the amount of $V_{ref}$ temperature coefficient shift after solder-down by $V_{BE}$ shift depends on the distance of each array portion making up the overall array from the die center point. In particular, by putting transistors of the array at differently-stressed die locations relative to the die center point, the absolute shift can be offset by the relative shift.

To this end, and with reference to the top down view of FIG. 10b, further note that the use of the techniques provided herein can be detected, for instance, by a top down view of the die that shows two distinct transistor arrays (or sub-arrays) spaced from one another, wherein a distance D is between the two sub-arrays making up the overall array, and the distance D is greater than the spacing between two adjacent individual transistors of any one array. In this particular example case, array A is distance $D_1$ from the die center point, and array B is distance $D_2$ from the die center point. Note the distances are with respect to the geometric center of the respective array portions, in some example embodiments, but can be with respect to other points according to other embodiments (such as distance to the edge of an array portion). In any case, given a stress profile that is radially symmetric about the die center point, array A will experience less stress than array B. This stress delta between locations A and B is shown in FIG. 10a, and is about 17 Mpa, with location A being about 0.78 mm from the die center, and location B being about 0.22 mm from the die center.

Figure 11A:
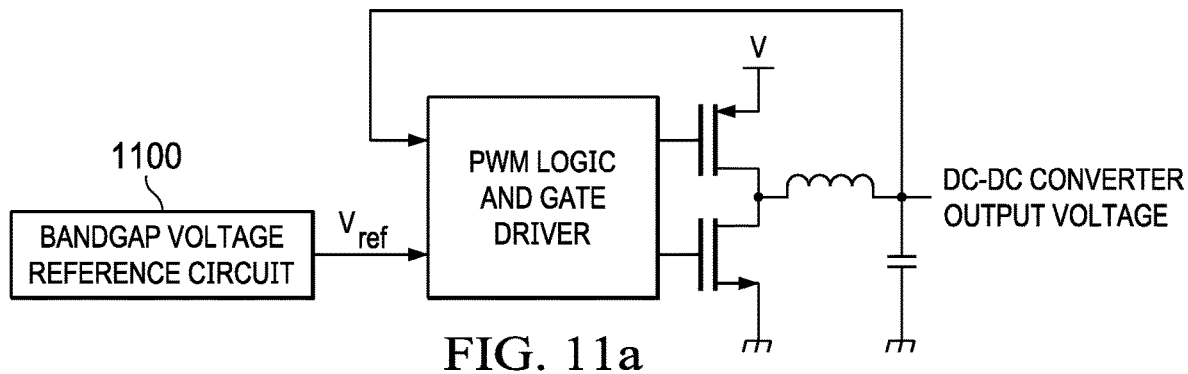
FIGS. 11a-e each illustrates an example electronic system that employs a bandgap voltage reference circuit configured with a spatially distributed transistor array, in accordance with an embodiment of the present disclosure.
Figure 11B:
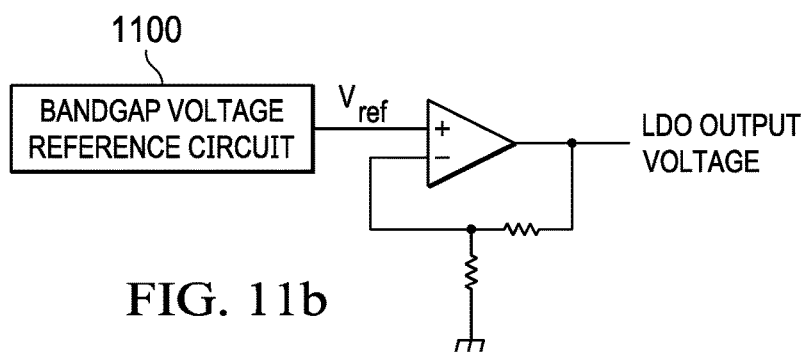
Figure 11C:
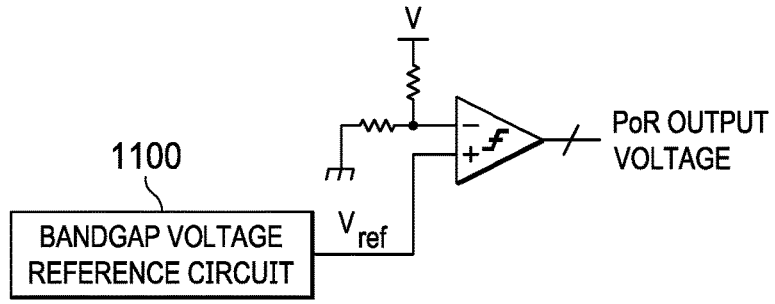
Figure 11D:
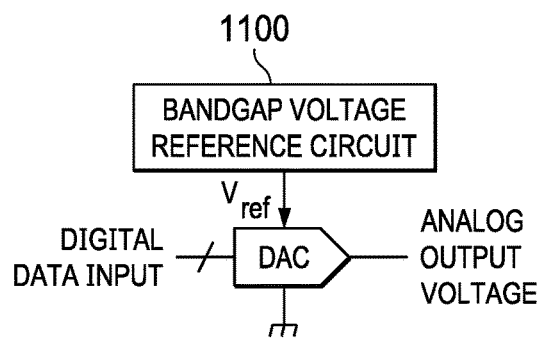
Figure 11E:
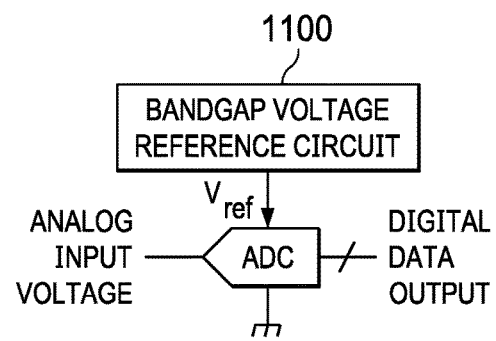

FIGS. 11a-e each illustrates an example electronic system that employs a bandgap voltage reference circuit configured with a spatially distributed transistor array, in accordance with an embodiment of the present disclosure. Note that the specific implementation details of the example circuits are not particularly relevant, other than the fact that they use a bandgap voltage reference circuit. FIG. 11a shows an example DC-DC converter circuit that uses bandgap voltage reference circuit 1100 to provide a $V_{ref}$. FIG. 11b shows an example low-dropout linear regulator (LDO) circuit that uses bandgap voltage reference circuit 1100 to provide a $V_{ref}$. FIG. 11c shows an example power-on-reset (POR) circuit that uses bandgap voltage reference circuit 1100 to provide a $V_{ref}$. FIG. 11d shows an example digital-to-analog converter (DAC) circuit that uses bandgap voltage reference circuit 1100 to provide a $V_{ref}$. FIG. 11e shows an example analog-to-digital converter (ADC) circuit that uses bandgap voltage reference circuit 1100 to provide a $V_{ref}$. In any of these example electronic systems, the bandgap voltage reference circuit 1100 can be, for example, any one of the examples variously provided herein, as will be appreciated.

Further Example Embodiments

Example 1 is an integrated circuit, comprising: a package; and a die fixed within the package and including a bandgap voltage reference circuit, the die having opposing edges that partially define an outer perimeter of the die, the opposing edges separated by a distance $D_1$. The bandgap voltage reference circuit includes: a first transistor at a first location of the die and to operate with a first base-emitter voltage; a second transistor at a second location of the die and to operate with a second base-emitter voltage, the second location being separated from the first location by a distance $D_2$; and a resistance or capacitance operatively coupled to the first and second transistors such that a voltage difference between the first and second base-emitter voltages drops across the resistance or capacitance. The distance $D_2$ is at least 1.5% of the distance $D_1$.

Example 2 includes the integrated circuit of Example 1, wherein the distance $D_2$ is in the range of 3% to 55% of the distance $D_1$.

Example 3 includes the integrated circuit of Example 1 or 2, wherein the distance $D_2$ is in the range of 5% to 45% of the distance $D_1$.

Example 4 includes the integrated circuit of any of Examples 1 through 3, wherein the die is rectangular in shape and has a center point, and wherein the first location is within 10% of the distance $D_1$ to the center point of the die, and the second location is within 10% of the distance $D_1$ to one of the opposing edges of the die.

Example 5 includes the integrated circuit of any of Examples 1 through 4, wherein the die is rectangular in shape and has a center point, and wherein surface stress of the die near the center point is greater than surface stress of the die near each of the opposing edges. The first transistor is included in a first transistor array at the first location, and the second transistor is included in a second transistor array at the second location. The first location is associated with a first surface stress, and the second location is associated with a second surface stress, and wherein the first location is closer to the center point than the second location, such that the first surface stress is greater than the second surface stress.

Example 6 includes the integrated circuit of any of Examples 1 through 5, wherein the second transistor is a plurality of individual transistors connected in parallel and that operate with the second base-emitter voltage, and at least one of the individual transistors is included in an array at the first location, the array further including the first transistor.

Example 7 includes the integrated circuit of any of Examples 1 through 6, and further includes a summing circuit configured to generate a voltage reference output based on (1) the voltage difference between the first and second base-emitter voltages and (2) the first base-emitter voltage or another base-emitter voltage.

Example 8 is an electronics system comprising: a printed circuit board; and the integrated circuit of any of Examples 1 through 7, soldered to the printed circuit board.

Example 9 is a digital-to-analog converter comprising the integrated circuit of any of Examples 1 through 7, or the electronics system of Example 8.

Example 10 is an integrated circuit, comprising: a package; and a die fixed within the package and including a bandgap voltage reference circuit, the bandgap voltage reference circuit configured to add a proportional to absolute temperature (PTAT) voltage to a complementary to absolute temperature (CTAT) voltage. The bandgap voltage reference circuit includes: an array including a first bipolar junction transistor (BJT) and a second BJT, the first BJT to operate with a first base-emitter voltage, and the second BJT to operate with a second base-emitter voltage, wherein the centroid of the array, the centroid of the first BJT, and the centroid of the second BJT are spaced from one another; a PTAT element operatively coupled to the first and second BJTs such that a voltage difference between the first and second base-emitter voltages drops across the PTAT element; and a summing circuit configured to generate a voltage reference output based on (1) the voltage difference between the first and second base-emitter voltages and (2) the first base-emitter voltage or another base-emitter voltage.

Example 11 includes the integrated circuit of Example 10, wherein the array includes: one or more individual BJTs that operate with the first base-emitter voltage to provide the first BJT; one or more individual BJTs that operate with the second base-emitter voltage to provide the second BJT; and one or more individual BJTs that are not connected so as to provide one or more dummy devices; wherein the one or more individual BJTs of the first BJT are spaced from the one or more individual BJTs of the second BJT by the one or more dummy devices.

Example 12 includes the integrated circuit of Example 10 or 11, wherein: the array includes first and second arrays spaced from one another by a distance, and wherein the first BJT includes one or more individual BJTs from the first array and/or the second array, and the second BJT includes one or more individual BJTs from the first array and/or the second array, the distance between the first and second arrays being greater than or equal to the lateral width of one individual BJT of the array; or the array includes first and second sub-arrays spaced from one another by a distance, and wherein the first BJT includes one or more individual BJTs from the first sub-array and/or the second sub-array, and the second BJT includes one or more individual BJTs from the first sub-array and/or the second sub-array, the distance between the first and second sub-arrays being greater than or equal to the lateral width of one individual BJT of the array.

Example 13 includes the integrated circuit of any of Examples 10 through 12, wherein the first BJT is at a first location of the die, and the second BJT is at a second location of the die, the second location being separated from the first location by a distance, and wherein the second BJT is a plurality of individual BJTs connected in parallel and that operate with the second base-emitter voltage, and at least one of the individual BJTs is at the first location.

Example 14 includes the integrated circuit of any of Examples 10 through 13, wherein the first and second BJTs each comprise one or more diode-connected BJTs, and the PTAT element comprises one or more resistors or one or more capacitors.

Example 15 is an electronics system comprising: a printed circuit board; and the integrated circuit of any of Examples 10 through 14, soldered to the printed circuit board, wherein the integrated circuit comprises an analog-to-digital converter and/or a digital-to-analog converter.

Example 16 is an integrated circuit, comprising: a package; and a die fixed within the package and including a bandgap voltage reference circuit, the die having a center point and a stress profile such that surface stress of the die decreases with increasing distance from the center point, the bandgap voltage reference circuit configured to add a proportional to absolute temperature (PTAT) voltage to a complementary to absolute temperature (CTAT) voltage. The bandgap voltage reference circuit includes: a first bipolar junction transistor at a first location of the die and to operate with a first base-emitter voltage, the first location being a first distance from the center point of the die and associated with a first stress value; a second bipolar junction transistor at a second location of the die and to operate with a second base-emitter voltage, the second location being a second distance from the center point of the die and associated with a second stress value, the second distance different from the first distance, and the second stress value different from the first stress value; a resistance or capacitance operatively coupled to the first and second bipolar junction transistors such that a voltage difference between the first and second base-emitter voltages drops across the resistance or capacitance; and a summing circuit configured to generate a voltage reference output based on (1) the voltage difference between the first and second base-emitter voltages and (2) the first base-emitter voltage or another base-emitter voltage.

Example 17 includes the integrated circuit of Example 16, wherein the resistance or capacitance is a resistor.

Example 18 includes the integrated circuit of Example 16 or 17, wherein the second bipolar junction transistor is a plurality of individual bipolar junction transistors connected in parallel and that operate with the second base-emitter voltage, and at least one of the individual bipolar junction transistors is included in an array at the first location, the array further including the first bipolar junction transistor.

Example 19 includes the integrated circuit of any of Examples 16 through 18, wherein the first bipolar junction transistor is M individual bipolar junction transistors connected in parallel and that operate with the first base-emitter voltage, and the second bipolar junction transistor is N individual bipolar junction transistors connected in parallel and that operate with the second base-emitter voltage, and at least one of the N individual bipolar junction transistors is at the first location.

Example 20 includes the integrated circuit of Example 19, wherein: M equals 2 and N equals 16; the second location includes a center point of the die; and the second stress value is greater than the first stress value.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

The invention claimed is:

1. An integrated circuit, comprising:
 a package; and
 a die fixed within the package and including a bandgap voltage reference circuit, the die having opposing edges that partially define an outer perimeter of the die, the opposing edges separated by a distance $D_1$, the bandgap voltage reference circuit including
  a first transistor at a first location of the die and to operate with a first base-emitter voltage,
  a second transistor at a second location of the die and to operate with a second base-emitter voltage, the second location being separated from the first location by a distance $D_2$, and
  a resistor operatively coupled to the first and second transistors such that a voltage difference between the first and second base-emitter voltages drops across the resistor;
 wherein the distance $D_2$ is at least 1.5% of the distance $D_1$.

2. The integrated circuit of claim 1, wherein the distance $D_2$ is in the range of 3% to 55% of the distance $D_1$.

3. The integrated circuit of claim 1, wherein the distance $D_2$ is in the range of 5% to 45% of the distance $D_1$.

4. The integrated circuit of claim 1, wherein the die is rectangular in shape and has a center point, and wherein the first location is within 10% of the distance $D_1$ to the center point of the die, and the second location is within 10% of the distance $D_1$ to one of the opposing edges of the die.

5. The integrated circuit of claim 1, wherein the die is rectangular in shape and has a center point, and wherein surface stress of the die near the center point is greater than surface stress of the die near each of the opposing edges, and wherein the first transistor is included in a first transistor array at the first location, and the second transistor is included in a second transistor array at the second location, and wherein the first location is associated with a first surface stress, and the second location is associated with a second surface stress, and wherein the first location is closer to the center point than the second location, such that the first surface stress is greater than the second surface stress.

6. The integrated circuit of claim 1, wherein the second transistor is a plurality of individual transistors connected in parallel and that operate with the second base-emitter voltage, and at least one of the individual transistors is included in an array at the first location, the array further including the first transistor.

7. The integrated circuit of claim 1, further comprising a summing circuit configured to generate a voltage reference output based on (1) the voltage difference between the first and second base-emitter voltages and (2) the first base-emitter voltage or another base-emitter voltage.

8. An electronics system comprising:
 a printed circuit board; and
 the integrated circuit of claim 1 soldered to the printed circuit board.

9. A digital-to-analog converter comprising the integrated circuit of claim 1.

10. An integrated circuit, comprising:
 a package; and
 a die fixed within the package and including a bandgap voltage reference circuit, the bandgap voltage reference circuit configured to add a proportional to absolute temperature (PTAT) voltage to a complementary to absolute temperature (CTAT) voltage, the bandgap voltage reference circuit including
  an array including a first bipolar junction transistor (BJT) and a second BJT, the first BJT to operate with a first base-emitter voltage, and the second BJT to operate with a second base-emitter voltage, wherein the centroid of the array, the centroid of the first BJT, and the centroid of the second BJT are spaced from one another,
  a PTAT element operatively coupled to the first and second BJTs such that a voltage difference between the first and second base-emitter voltages drops across the PTAT element, and a summing circuit configured to generate a voltage reference output based on (1) the voltage difference between the first and second base-emitter voltages and (2) the first base-emitter voltage or another base-emitter voltage.

11. The integrated circuit of claim 10, wherein the array includes: one or more individual BJTs that operate with the first base-emitter voltage to provide the first BJT; one or more individual BJTs that operate with the second base-emitter voltage to provide the second BJT; and one or more individual BJTs that are not connected so as to provide one or more dummy devices; wherein the one or more individual BJTs of the first BJT are spaced from the one or more individual BJTs of the second BJT by the one or more dummy devices.

12. The integrated circuit of claim 10, wherein:
the array includes first and second arrays spaced from one another by a distance, and wherein the first BJT includes one or more individual BJTs from the first array and the second array, and the second BJT includes one or more individual BJTs from the first array and the second array, the distance between the first and second arrays being greater than or equal to the lateral width of one individual BJT of the array; or
the array includes first and second sub-arrays spaced from one another by a distance, and wherein the first BJT includes one or more individual BJTs from the first sub-array and the second sub-array, and the second BJT includes one or more individual BJTs from the first sub-array and the second sub-array, the distance between the first and second sub-arrays being greater than or equal to the lateral width of one individual BJT of the array.

13. The integrated circuit of claim 10, wherein the first BJT is at a first location of the die, and the second BJT is at a second location of the die, the second location being separated from the first location by a distance, and wherein the second BJT is a plurality of individual BJTs connected in parallel and that operate with the second base-emitter voltage, and at least one of the individual BJTs is at the first location.

14. The integrated circuit of claim 10, wherein the first and second BJTs each comprise one or more diode-connected BJTs, and the PTAT element comprises a resistor.

15. An electronics system comprising:
a printed circuit board; and
the integrated circuit of claim 10 soldered to the printed circuit board, wherein the integrated circuit comprises an analog-to-digital converter and a digital-to-analog converter.

16. An integrated circuit, comprising:
a package; and
a die fixed within the package and including a bandgap voltage reference circuit, the die having a center point and a stress profile such that surface stress of the die decreases with increasing distance from the center point, the bandgap voltage reference circuit configured to add a proportional to absolute temperature (PTAT) voltage to a complementary to absolute temperature (CTAT) voltage, the bandgap voltage reference circuit including
a first bipolar junction transistor at a first location of the die and to operate with a first base-emitter voltage, the first location being a first distance from the center point of the die and associated with a first stress value,
a second bipolar junction transistor at a second location of the die and to operate with a second base-emitter voltage, the second location being a second distance from the center point of the die and associated with a second stress value, the second distance different from the first distance, and the second stress value different from the first stress value,
a resistor operatively coupled to the first and second bipolar junction transistors such that a voltage difference between the first and second base-emitter voltages drops across the resistor; and
a summing circuit configured to generate a voltage reference output based on (1) the voltage difference between the first and second base-emitter voltages and (2) the first base-emitter voltage or another base-emitter voltage.

17. The integrated circuit of claim 16, wherein the second bipolar junction transistor is a plurality of individual bipolar junction transistors connected in parallel and that operate with the second base-emitter voltage, and at least one of the individual bipolar junction transistors is included in an array at the first location, the array further including the first bipolar junction transistor.

18. The integrated circuit of claim 16, wherein the first bipolar junction transistor is M individual bipolar junction transistors connected in parallel and that operate with the first base-emitter voltage, and the second bipolar junction transistor is N individual bipolar junction transistors connected in parallel and that operate with the second base-emitter voltage, and at least one of the N individual bipolar junction transistors is at the first location.

19. The integrated circuit of claim 18, wherein: M equals 2 and N equals 16; the second location includes a center point of the die; and the second stress value is greater than the first stress value.

* * * * *